(12) United States Patent
Won et al.

(10) Patent No.: US 11,505,740 B2
(45) Date of Patent: Nov. 22, 2022

(54) CADMIUM FREE QUANTUM DOTS

(71) Applicant: SAMSUNG ELECTRONICS CO., LTD., Suwon-si (KR)

(72) Inventors: Yuho Won, Seoul (KR); Nayoun Won, Suwon-si (KR); Sungwoo Hwang, Suwon-si (KR); Eun Joo Jang, Suwon-si (KR); Soo Kyung Kwon, Suwon-si (KR); Yong Wook Kim, Yongin-si (KR); Jihyun Min, Seoul (KR); Garam Park, Seoul (KR); Shang Hyeun Park, Yongin-si (KR); Hyo Sook Jang, Suwon-si (KR); Shin Ae Jun, Seongnam-si (KR); Yong Seok Han, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/490,552

(22) Filed: Sep. 30, 2021

(65) Prior Publication Data

US 2022/0017818 A1    Jan. 20, 2022

Related U.S. Application Data

(63) Continuation of application No. 16/245,544, filed on Jan. 11, 2019, now Pat. No. 11,142,685.

(30) Foreign Application Priority Data

Jan. 11, 2018    (KR) .................. 10-2018-0003829

(51) Int. Cl.
*H01L 51/50* (2006.01)
*C09K 11/08* (2006.01)
*C08L 57/10* (2006.01)
*G02F 1/13357* (2006.01)
*H01L 27/32* (2006.01)
*C09K 11/02* (2006.01)
*C09K 11/56* (2006.01)
*C09K 11/70* (2006.01)
*C09K 11/88* (2006.01)
*H05B 33/14* (2006.01)
*B82Y 40/00* (2011.01)
*B82Y 20/00* (2011.01)
*G02F 1/1335* (2006.01)

(52) U.S. Cl.
CPC .......... *C09K 11/0883* (2013.01); *C08L 57/10* (2013.01); *C09K 11/025* (2013.01); *C09K 11/565* (2013.01); *C09K 11/70* (2013.01); *C09K 11/883* (2013.01); *G02F 1/133617* (2013.01); *H01L 27/322* (2013.01); *H01L 51/502* (2013.01); *H05B 33/14* (2013.01); *B82Y 20/00* (2013.01); *B82Y 40/00* (2013.01); *C08L 2203/20* (2013.01); *G02F 1/133614* (2021.01); *G02F 2202/022* (2013.01); *G02F 2202/102* (2013.01); *G02F 2202/36* (2013.01)

(58) Field of Classification Search
CPC . C09K 11/0883; C09K 11/025; C09K 11/565; C09K 11/70; C09K 11/883; C09K 11/02; C08L 57/10; C08L 2203/20; G02F 1/133617; G02F 1/133614; G02F 2202/022; G02F 2202/102; G02F 2202/36; H01L 27/322; H01L 51/502; H01L 33/502; H05B 33/14; B82Y 20/00; B82Y 40/00; B82Y 30/00; G03F 7/004; G03F 7/027; G03F 7/028; G03F 7/033
See application file for complete search history.

(56) References Cited

U.S. PATENT DOCUMENTS

| | | |
|---|---|---|
| 9,169,435 B2 | 10/2015 | Guo et al. |
| 9,577,149 B2 | 2/2017 | Lu et al. |
| 9,631,141 B2 | 4/2017 | Guo et al. |
| 9,685,583 B2 | 6/2017 | Guo et al. |
| 9,884,993 B2 | 2/2018 | Guo et al. |
| 9,957,442 B2 | 5/2018 | Banin et al. |
| 10,627,672 B2 | 4/2020 | Jang et al. |
| 10,707,371 B2 | 7/2020 | Guo et al. |
| 2014/0001405 A1* | 1/2014 | Guo ............... C09K 11/565 423/299 |
| 2014/0117292 A1 | 5/2014 | Jun et al. |

(Continued)

FOREIGN PATENT DOCUMENTS

| | | |
|---|---|---|
| EP | 3184603 A1 | 6/2017 |
| JP | 2013539798 A | 10/2013 |

(Continued)

OTHER PUBLICATIONS

Christian Ippen et al., "InP/ZnSe/ZnS: A Novel Multishell System for InP Quantum Dots for Improved Luminescence Efficiency and Its application in a Light-Emitting Device", Journal of Information Display, Jun. 22, 2012, pp. 91-95, vol. 13, No. 2.

(Continued)

*Primary Examiner* — Donald L Raleigh

(74) *Attorney, Agent, or Firm* — Cantor Colburn LLP

(57) ABSTRACT

A cadmium free quantum dot not including cadmium and including: a semiconductor nanocrystal core comprising indium and phosphorous, a first semiconductor nanocrystal shell disposed on the semiconductor nanocrystal core and comprising zinc and selenium, and a second semiconductor nanocrystal shell disposed on the first semiconductor nanocrystal shell and comprising zinc and sulfur, a composition and composite including the same, and an electronic device.

26 Claims, 6 Drawing Sheets

(56) References Cited

U.S. PATENT DOCUMENTS

| | | |
|---|---|---|
| 2015/0109814 A1 | 4/2015 | Chen et al. |
| 2017/0058199 A1 | 3/2017 | Jang et al. |
| 2017/0160431 A1 | 6/2017 | You et al. |
| 2017/0183565 A1 | 6/2017 | Jun et al. |
| 2017/0250322 A1 | 8/2017 | Wang et al. |
| 2017/0349824 A1 | 12/2017 | Kan |
| 2017/0373232 A1 | 12/2017 | Kan et al. |
| 2018/0119007 A1 | 5/2018 | Ippen et al. |
| 2018/0188445 A1 | 7/2018 | Chang |
| 2018/0201834 A1 | 7/2018 | Banin et al. |

FOREIGN PATENT DOCUMENTS

| | | |
|---|---|---|
| JP | 2015529698 A | 10/2015 |
| JP | 2017063197 A | 3/2017 |
| KR | 1187663 B1 | 10/2012 |
| KR | 1537296 B1 | 7/2015 |
| KR | 20160072177 A | 6/2016 |
| KR | 20160109077 A | 9/2016 |
| KR | 1687086 B1 | 12/2016 |
| KR | 1722638 B1 | 4/2017 |
| WO | 2012035535 A1 | 3/2012 |
| WO | 2013127662 A1 | 9/2013 |
| WO | 2015094646 A1 | 6/2015 |
| WO | 2017096229 A1 | 6/2017 |
| WO | 2017201386 A1 | 11/2017 |
| WO | 2018108765 A1 | 6/2018 |

OTHER PUBLICATIONS

Extended European Search Report dated Jun. 5, 2019, of the corresponding European Patent Application No. 19151354.8.
Heejae Chung et al. "(Supporting Information for a Manuscript Entitled:)Composition-dependent Trap Distributions in CdSe and InP Quantum Dots Probed Using Photoluminescence Blinking Dynamics", Nanoscale, The Royal Society of Chemistry, May 23, 2016, pp. 14109-14116, vol. 8.
Ho-June Byun et al., "Solvothermal synthesis of InP quantum dots and their enhanced luminescent efficiency by post-synthetic treatments", Journal of Colloid and Interface Science, Dec. 13, 2010, pp. 35-41, vol. 355.
J. Andrzejewski, "Electronic Structure Calculations of InP-Based Coupled Quantum Dot-Quantum Well Structures", Proceedings the 44th International School and Conference on the Physics of Semiconductors "Jaszowiec 2015", Wisła, 2015, (DOI: 10.12693/APhysPolA.129.A-97), pp. 1-A97~A99, vol. 129.
Jaehoon Lim et al., "Highly Efficient Cadmium-Free Quantum Dot Light-Emitting Diodes Enabled by the Direct Formation of Excitons within InP@ZnSeS Quantum Dots", American Chemical Society, Sep. 24, 2013, pp. 9019-9026, vol. 7, No. 10.
Kyungnam Kim et al., "Highly luminescing multi-shell semiconductor nanocrystals InP/ZnSe/ZnS", Applied Physics Letters, (doi: 10.1063/1.4745844), Aug. 14, 2012, pp. 073107-1~073107-4, vol. 101.
Renguo Xie et al., "InAs/InP/ZnSe Core/Shell/Shell Quantum Dots as Near-Infrared Emitters: Bright, Narrow-Band, Non-Cadmium Containing, and Biocompatible", NIH Public Access, Author Manuscript, (Published in final edited form as: Nano Res. Dec. 14, 2008; 1(6): 457-464), Jul. 13, 2010, pp. 1-12.
Tonino Greco et al., "InP/ZnSe/ZnS core-multishell quantum dots for improved luminescence efficiency", Nanophotonics IV, May 1, 2012, pp. 1-9, vol. 8424 (842439), SPIE Photonics Europe, 2012, Brussels, Belgium.
Yohan Kim et al., "Increased shell thickness in indium phosphide multishell quantum dots leading to efficiency and stability enhancement in light-emitting diodes", Optical Materials Express, Jun. 26, 2014, pp. 1436-1443, vol. 4, Issue 7.
JP Office Action dated Jan. 18, 2022, of the corresponding Japanese Patent Application No. 2019-003319.

* cited by examiner

CADMIUM FREE QUANTUM DOTS

CROSS-REFERENCE TO RELATED APPLICATION

This application is a continuation application of application Ser. No. 16/245,544, filed Jan. 11, 2019, which claims priority to Korean Patent Application No. 10-2018-0003829, filed in the Korean Intellectual Property Office on Jan. 11, 2018, and all the benefits accruing therefrom under 35 U.S.C. § 119, the content of which is incorporated herein in its entirety by reference.

BACKGROUND

1. Field

Cadmium free quantum dots and uses thereof are disclosed.

2. Description of the Related Art

Quantum dots (e.g., nano-sized semiconductor nanocrystals) having different energy bandgaps may be obtained by controlling the sizes and compositions of the quantum dots. Quantum dots may exhibit electroluminescent and photoluminescent properties. In a colloidal synthesis, organic materials such as a dispersing agent may coordinate, e.g., be bound, to a surface of the semiconductor nanocrystal during the crystal growth thereof, thereby providing a quantum dot having a controlled size and showing, e.g., exhibiting, luminescent properties. From an environmental standpoint, developing a cadmium free quantum dot with improved luminescent properties is desirable.

SUMMARY

An embodiment provides a cadmium free quantum dot having improved photoluminescence properties and enhanced stability.

An embodiment provides a method of producing the cadmium free quantum dot.

Yet an embodiment provides a composition including the cadmium free quantum dot.

Still an embodiment provides a quantum dot-polymer composite including the cadmium free quantum dot.

Further an embodiment provides an electronic device including the quantum dot-polymer composite.

In an embodiment, a cadmium free quantum dot includes a semiconductor nanocrystal core including indium (In) and phosphorous (P), a first semiconductor nanocrystal shell disposed on the semiconductor nanocrystal core and including zinc and selenium, and a second semiconductor nanocrystal shell disposed on the first semiconductor nanocrystal shell and including zinc and sulfur, and wherein when the cadmium free quantum dot has a photoluminescent (PL) peak wavelength in a range from about 600 nanometers (nm) to about 650 nm, a molar ratio of indium to a sum of sulfur and selenium (i.e., [In:(Se+S)], hereinafter which may be recited as the value of [In/(Se+S)]) is greater than or equal to about 0.06:1 and less than or equal to about 0.3:1, or wherein when the cadmium free quantum dot has a photoluminescent peak wavelength in a range from about 500 nm to about 550 nm, a molar ratio of indium to a sum of sulfur and selenium is greater than or equal to about 0.027:1 and less than or equal to about 0.1:1.

A quantum efficiency (quantum yield) of the cadmium free quantum dot may be greater than 80%.

In an ultraviolet-visible (UV-Vis) absorption spectrum of the cadmium free quantum dot, a ratio of an intensity of 450 nm to that of the first absorption peak wavelength ($1^{st}$ OD) may be greater than or equal to about 1.1:1.

The semiconductor nanocrystal core may further include zinc.

The first semiconductor nanocrystal shell may not include sulfur.

The first semiconductor nanocrystal shell may be disposed directly on a surface of the semiconductor nanocrystal core.

A thickness of the first semiconductor nanocrystal shell may be greater than or equal to about 3 monolayers.

A thickness of the first semiconductor nanocrystal shell may be less than or equal to about 10 monolayers.

The second semiconductor nanocrystal shell may be an outermost layer of the quantum dot.

The second semiconductor nanocrystal shell may be disposed directly on a surface of the first semiconductor nanocrystal shell.

In an UV-Vis absorption spectrum of the cadmium free quantum dot, a ratio of an intensity of 450 nm (450 nm OD) to that of the first absorption peak wavelength ($1^{st}$ OD) may be greater than or equal to about 1.5:1.

A blue light absorption rate per one gram of the cadmium free quantum dot may be greater than or equal to 1.

A quantum efficiency of the cadmium free quantum dot may be greater than or equal to about 85%.

A quantum efficiency of the cadmium free quantum dot may be greater than or equal to about 88%.

A quantum efficiency of the cadmium free quantum dot may be greater than or equal to about 90%.

A full width at half maximum (FWHM) of the cadmium free quantum dot may be less than or equal to about 45 nm.

A full width at half maximum (FWHM) of the cadmium free quantum dot may be less than or equal to about 40 nm.

The first absorption peak wavelength of the cadmium free quantum dot may be present within a range of greater than about 450 nm and less than a photoluminescent peak wavelength of the cadmium free quantum dot.

In other embodiments, a method of producing the cadmium free quantum dot includes:

providing a first mixture including a first shell precursor containing zinc, an organic ligand, and an organic solvent;

optionally heating the first mixture;

preparing a second mixture by injecting to the optionally heated first mixture, a semiconductor nanocrystal core including indium and phosphorous, and a selenium containing precursor;

heating the second mixture to a first reaction temperature and maintaining the first reaction temperature for at least 40 minutes to obtain a third mixture including a particle having a first semiconductor nanocrystal shell including zinc and selenium formed on the semiconductor nanocrystal core;

adding a sulfur containing precursor to the third mixture at the first reaction temperature to form a second semiconductor nanocrystal shell containing zinc and sulfur on the first semiconductor nanocrystal shell, thereby obtaining the cadmium free quantum dot, wherein amounts of the selenium containing precursor and the sulfur containing precursor with respect to the indium in the second and third mixtures are controlled such that when the cadmium free quantum dot has a photoluminescent peak wavelength in a range from about 600 nm to about 650 nm, a molar ratio of indium to a sum of sulfur and selenium is greater than or equal to about 0.06:1 and less than or equal to about 0.3:1, and when the cadmium free quantum dot has a photoluminescent peak wavelength in a range from about 500 nm to about 550 nm, a molar ratio of indium to a sum of sulfur and selenium is greater than or equal to about 0.027:1 and less than or equal to about 0.1:1.

The method may not include lowering a temperature of the third mixture to a temperature of less than or equal to about 100° C., or less than or equal to about 50° C. (e.g., to a temperature of less than or equal to about 30° C.).

The second mixture is kept at the first reaction temperature for a time period of greater than or equal to about 50 min to form the first semiconductor nanocrystal shell having a thickness of greater than or equal to about 3 monolayers.

In an embodiment, a composition includes:

(e.g., a plurality of) the aforementioned cadmium free quantum dot(s);

a carboxylic acid group-containing binder;

a polymerizable (e.g., photopolymerizable) monomer including a carbon-carbon double bond; and an initiator (e.g., a photoinitiator), The carboxylic acid group-containing binder includes a copolymer of a monomer combination including a first monomer, a second monomer, and optionally a third monomer, the first monomer including a carboxylic acid group and a carbon-carbon double bond, the second monomer including a carbon-carbon double bond and a hydrophobic moiety and not including a carboxylic acid group, and the third monomer including a carbon-carbon double bond and a hydrophilic moiety and not including a carboxylic acid group;

a multi-aromatic ring-containing polymer including a carboxylic acid group and including a backbone structure in a main chain, wherein the backbone structure includes a cyclic group including a quaternary carbon atom and two aromatic rings bound to the quaternary carbon atom; or a combination thereof.

The carboxylic acid group-containing binder may have an acid value of greater than or equal to about 50 milligrams of KOH per gram and less than or equal to about 250 milligrams of KOH per gram.

The composition may further include a multi-thiol compound, a metal oxide particle, or a combination thereof.

The metal oxide particle may include $TiO_2$, $SiO_2$, $BaTiO_3$, $Ba_2TiO_4$, ZnO, or a combination thereof.

An amount of the metal oxide particle may be less than or equal to about 15 weight percent (wt %) based on a total solid content of the composition.

In an embodiment, a quantum dot polymer composite includes a polymer matrix; and a plurality of quantum dots dispersed in the polymer matrix, wherein the plurality of quantum dots includes the aforementioned cadmium free quantum dots.

The polymer matrix may include a crosslinked polymer, a binder polymer having a carboxylic acid group, or a combination thereof.

The polymer matrix may include a binder polymer, a polymerization product of a photopolymerizable monomer including at least carbon-carbon double bond, optionally a polymerization product of the photopolymerizable monomer and a multi-thiol compound having at least two thiol groups at the terminal end of the multi-thiol compound, or a combination thereof.

The plurality of the quantum dots may not include cadmium.

A blue light absorption rate of the quantum dot polymer composite with respect to light having a wavelength of 450 nm may be greater than or equal to about 82% for example when an amount of the cadmium free quantum dot is about 45% based on a total weight of the composite.

The quantum dot polymer composite may exhibit a photoconversion efficiency (PCE) of greater than or equal to about 20% when the quantum dot polymer composite is heat-treated at a temperature of about 180° C. for 30 minutes in a nitrogen atmosphere.

In an embodiment, a display device includes a light source and a light emitting element (e.g., photoluminescence element), wherein the light emitting element includes the aforementioned quantum dot-polymer composite and the light source is configured to provide the light emitting element with incident light.

The incident light may have a luminescence peak wavelength of about 440 nm to about 460 nm.

In an embodiment, the light emitting element may include a sheet of the quantum dot polymer composite.

The display device may further include a liquid crystal panel, and a sheet of the quantum dot polymer composite may be disposed between the light source and the liquid crystal panel.

In other embodiments, the display device includes as the light emitting element a stacked structure including a substrate and a light emitting layer disposed on the substrate, wherein the light emitting layer includes a pattern of the quantum dot polymer composite and the pattern includes at least one repeating section configured to emit light at a predetermined wavelength.

The pattern may include a first section configured to emit a first light and a second section configured to emit a second light having a different center wavelength from the first light.

The light source may include a plurality of light-emitting units corresponding to each of the first section and the second section, wherein the light-emitting units may include a first electrode and a second electrode facing each other and an electroluminescence layer disposed between the first electrode and the second electrode.

The display device may further include a lower substrate, a polarizer disposed under the lower substrate, and a liquid crystal layer disposed between the stack structure and the lower substrate, wherein the stacked structure is disposed so that the light emitting layer faces the liquid crystal layer.

The display device may further include a polarizer between the liquid crystal layer and the light emitting layer.

The light source may include a light emitting diode (LED) and optionally a light guide panel.

The cadmium free quantum dot according to an embodiment may have improved luminous properties (e.g., an enhanced blue light absorption) together with improved stability. A composition including the cadmium free quantum dot according to an embodiment may provide improved process stability. The cadmium free quantum dot may be used in various display devices and biological labelling (e.g., bio sensor, bio imaging, etc.), a photo detector, a solar cell, a hybrid composite, and the like.

BRIEF DESCRIPTION OF THE DRAWINGS

These and/or other aspects will become apparent and more readily appreciated from the following description of embodiments, taken in conjunction with the accompanying drawings in which.

DETAILED DESCRIPTION

Figure 1:
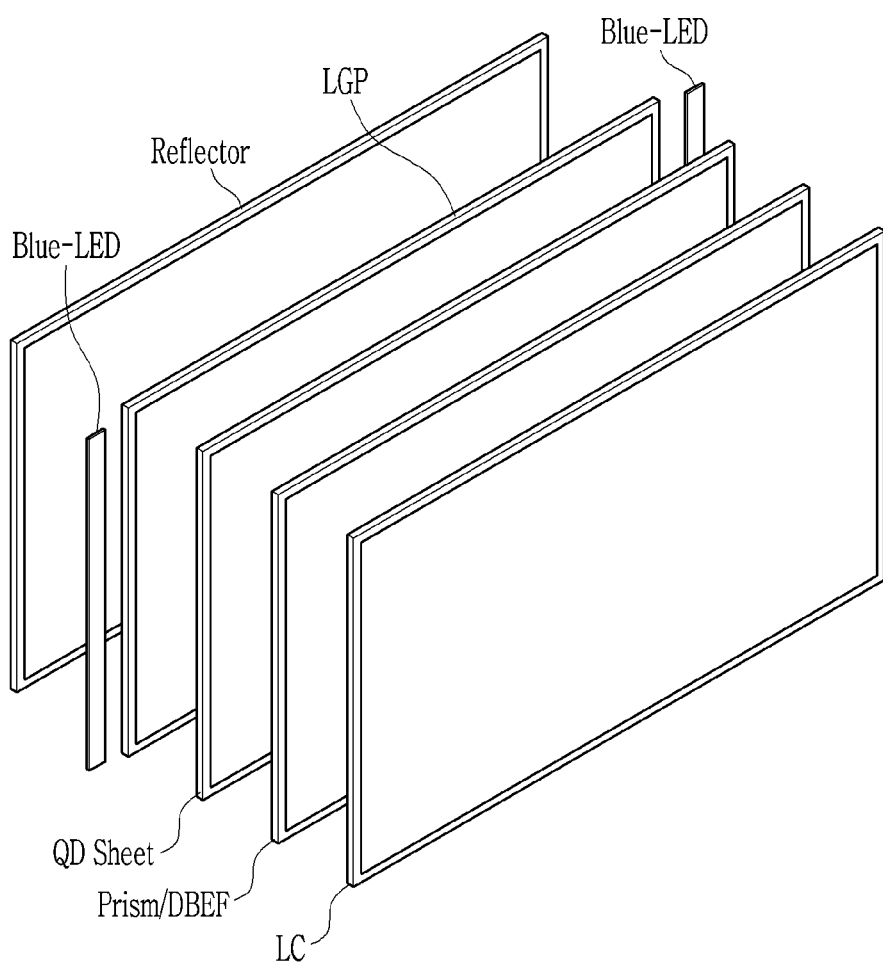
FIG. 1 is an exploded view of a display device according to an embodiment.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer" or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, unless a definition is otherwise provided, the term "substituted" refers to a compound or a group or a moiety wherein at least one hydrogen atom thereof is substituted with a substituent. The substituent may include a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are the same or different, and are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), a group represented by the formula =N—R (wherein R is hydrogen or a C1 to C10 linear or branched alkyl group), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, unless a definition is otherwise provided, the term "hetero" means that the compound or group includes at least one (e.g., one to three) heteroatom(s), wherein the heteroatom(s) is each independently N, O, S, Si, or P.

As used herein, unless a definition is otherwise provided, the term "alkylene group" refers to a straight or branched chain, saturated aliphatic hydrocarbon group having a valence of at least two. The alkylene group may be optionally substituted with one or more substituents.

As used herein, unless a definition is otherwise provided, the term "arylene group" refers to a functional group having a valence of at least two and formed by the removal of at least two hydrogen atoms from one or more rings of an aromatic hydrocarbon, wherein the hydrogen atoms may be removed from the same or different rings (preferably different rings), each of which rings may be aromatic or nonaromatic. The arylene group may be optionally substituted with one or more substituents.

As used herein, unless a definition is otherwise provided, the term "aliphatic hydrocarbon group" refers to a C1 to C30 linear or branched alkyl group, C2 to C30 linear or branched alkenyl group, and C2 to C30 linear or branched alkynyl group, the term "aromatic hydrocarbon group" refers to a C6 to C30 aryl group or a C2 to C30 heteroaryl group, and the term "alicyclic hydrocarbon group" refers to a C3 to C30 cycloalkyl group, a C3 to C30 cycloalkenyl group, and a C3 to C30 cycloalkynyl group.

As used herein, unless a definition is otherwise provided, the term "(meth)acrylate" refers to acrylate and/or methacrylate. The (meth)acrylate may include a (C1 to C10 alkyl) acrylate and/or a (C1 to C10 alkyl) methacrylate.

In some non-limiting embodiments, the term "hydrophobic moiety" refers to a moiety that may cause a compound including the same to agglomerate in an aqueous (hydrophilic) solution and to have a tendency of repelling water. For example, the hydrophobic moiety may include an aliphatic hydrocarbon group (e.g., alkyl, alkenyl, alkynyl, etc.) having at least one (e.g., at least two, three, four, five, or six, or higher) carbon atoms, an aromatic hydrocarbon group having at least six carbon atoms (e.g., phenyl, naphthyl, arylalkyl group, etc.), or an alicyclic hydrocarbon group having at least five carbon atoms (e.g., cyclohexyl, norbornenyl, etc.). In some non-limiting embodiments, the hydrophobic moiety may substantially lack the ability to form a hydrogen bond with a hydrophilic medium and may not be substantially mixed with the medium (e.g., a hydrophilic medium) as the polarity of the hydrophobic moiety does not match that of the medium (e.g., a hydrophilic medium).

As used herein, a photoconversion efficiency refers to a ratio of emission light amount of a quantum dot polymer composite with respect to absorbed light amount by the composite from incident light (e.g., blue light). The total light amount (B) of excitation light may be obtained by integration of a photoluminescence (PL) spectrum of the incident light, the PL spectrum of the quantum dot-polymer composite film is measured to obtain a dose (A) of light in a green or red wavelength region emitted from the quantum dot-polymer composite film and a dose (B') of incident light passing through the quantum dot-polymer composite film, and a photoconversion efficiency is obtained by the following equation:

$$A/(B-B') \times 100\% = \text{photoconversion efficiency (\%)}$$

As used herein, unless a definition is otherwise provided, the term "dispersion" refers to a system in which a dispersed phase is a solid and a continuous phase includes a liquid. For example, the term "dispersion" may refer to a colloidal dispersion, wherein the dispersed phase includes particles having a dimension of at least about 1 nm (e.g., at least about 2 nm, at least about 3 nm, or at least about 4 nm) and less than or equal to about several micrometers (μm) (e.g., 2 μm or less, or 1 μm or less).

As used herein, unless a definition is otherwise provided, the term "Group" in the term Group III, Group II, and the like refers to a group of the Periodic Table of Elements.

As used herein, "Group I" refers to Group IA and Group IB, and may include Li, Na, K, Rb, and Cs but are not limited thereto.

As used herein, "Group II" refers to Group IIA and a Group IIB, and examples of the Group II metal may include Cd, Zn, Hg, and Mg, but are not limited thereto.

As used herein, "Group III" refers to Group IIIA and Group IIIB, and examples of the Group III metal may include Al, In, Ga, and TI, but are not limited thereto.

As used herein, "Group IV" refers to Group IVA and Group IVB, and examples of the Group IV metal may include Si, Ge, and Sn but are not limited thereto. As used herein, the term "a metal" may include a semi-metal such as Si.

As used herein, "Group V" refers to Group VA and may include nitrogen, phosphorus, arsenic, antimony, and bismuth but is not limited thereto.

As used herein, "Group VI" refers to Group VIA and may include sulfur, selenium, and tellurium, but are not limited thereto.

As used herein, the term "blue light absorption rate per one gram of quantum dots" refers to a value calculated as follows:

For an organic solution including a predetermined weight of quantum dots and an organic solvent (such as toluene) (in an amount of a predetermined times (e.g., 100 times) of the weight of the quantum dot), a UV-Vis absorption spectroscopic analysis is made using a UV-Vis spectrometer, and an absorption value at a wavelength of 450 nm (450 nm optical density (OD)) is measured and is divided by the predetermined weight of the quantum dot.

A semiconductor nanocrystal particle (also known as a quantum dot) is a nano-sized crystalline material. The semiconductor nanocrystal particle may have a large surface area per unit volume due to the relatively small size of the semiconductor nanocrystal particle and may exhibit different characteristics from bulk materials having the same composition due to a quantum confinement effect. Quantum dots may absorb light from an excitation source to be excited, and may emit energy corresponding to the energy bandgap of the quantum dots.

The quantum dots have a potential applicability to various devices (e.g., an electronic device) due to unique photoluminescence characteristics. The quantum dots exhibiting properties applicable to an electronic device and the like may be cadmium-based. However, cadmium causes a serious environment/health problem and thus is one of restricted elements. As a type of cadmium free quantum dot, a Group III-V-based nanocrystal was researched a lot. However, the cadmium free quantum dot has poor photoluminescence properties (e.g., a full width at half maximum (FWHM) and luminous efficiency) compared with those of a cadmium-based quantum dot. Photoluminescence properties of the cadmium free quantum dot may substantially deteriorate, especially when the cadmium free quantum dot is subjected to various processes for application as an electronic device.

A cadmium free quantum dot (hereinafter, also referred to as "quantum dot") of an embodiment does not include cadmium. A cadmium free quantum dot of an embodiment includes a semiconductor nanocrystal core including indium and phosphorous, a first semiconductor nanocrystal shell disposed on the semiconductor nanocrystal core and including zinc and selenium, and a second semiconductor nanocrystal shell disposed on the first semiconductor nanocrystal shell and including zinc and sulfur.

When the cadmium free quantum dot has a photoluminescent peak wavelength in a range from about 600 nm to about 650 nm, a molar (e.g., amount) ratio of indium with respect to a sum of sulfur and selenium (In/(Se+S)) is greater than or equal to about 0.06:1 and less than or equal to about 0.3:1.

When the cadmium free quantum dot has a photoluminescent peak wavelength in a range from about 500 nm to about 550 nm, a molar ratio of indium with respect to a sum of sulfur and selenium (In/(Se+S)) is greater than or equal to about 0.027:1, for example, greater than or equal to about 0.028:1, greater than or equal to about 0.029:1, greater than or equal to about 0.03:1, or greater than or equal to about 0.035:1, and less than or equal to about 0.1:1, for example, less than or equal to about 0.065:1, or less than or equal to about 0.064:1. A quantum efficiency of the cadmium free quantum dot is greater than about 80%.

In an UV-Vis absorption spectrum, the cadmium free quantum dot may have a ratio of an intensity of 450 nm with respect to that of the first absorption peak wavelength ($1^{st}$ OD) that is greater than or equal to about 1.1:1. As used herein, "the first absorption peak wavelength" refers to a main peak appearing first from the lowest energy region.

Quantum dots may use a blue light (e.g., having a wavelength of about 450 nm) as an excitation light. The cadmium based quantum dot has a high intensity of absorption for such a blue light. However, in the case of a cadmium free quantum dot, an absorption intensity at the blue light (e.g., having a wavelength of about 450 nm) may not be high, which may lead to a decrease in brightness. The quantum dot does not include cadmium but may exhibit a greatly improved level of blue light absorption. In an embodiment, the UV-Vis absorption spectrum of the cadmium free quantum dot may exhibit a ratio of an intensity of 450 nm (450 nm OD) with respect to that of the first absorption peak wavelength ($1^{st}$ OD) (Abs) that is greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, or greater than or equal to about 2:1.

In an embodiment, the semiconductor nanocrystal core may further include zinc. The semiconductor nanocrystal core may include InP or InZnP. A size of the core may be selected appropriately in light of a photoluminescent peak of the quantum dot. In an embodiment, the size of the core may be greater than or equal to about 1 nm, greater than or equal to about 1.5 nm, or greater than or equal to about 2 nm. In an embodiment, the size of the core may be less than or equal to about 4 nm, or less than or equal to about 3 nm.

The first semiconductor nanocrystal shell may include (e.g., consist of) ZnSe. The first semiconductor nanocrystal shell may not include sulfur (S). In an embodiment, the first semiconductor nanocrystal shell may not include ZnSeS. The first semiconductor nanocrystal shell may be disposed directly on the semiconductor nanocrystal core. The first semiconductor nanocrystal shell may have a thickness of greater than or equal to about 3 monolayers (ML), or greater than or equal to about 4 ML. A thickness of the first semiconductor nanocrystal shell may be less than or equal to about 10 ML, for example, less than or equal to about 9 ML, less than or equal to about 8 ML, less than or equal to about 7 ML, less than or equal to about 6 ML, or less than or equal to about 5 ML.

In a green light emitting quantum dot, a molar ratio of the selenium with respect to indium may be greater than or equal to about 5:1, greater than or equal to about 10:1, or greater than or equal to about 15:1, and less than or equal to about 40:1, less than or equal to about 35:1, less than or equal to about 30:1, less than or equal to about 25:1, or less than or equal to about 20:1.

In a red light emitting quantum dot, a molar ratio of the selenium with respect to indium may be less than or equal to about 15:1, less than or equal to about 13:1, less than or equal to about 12:1, less than or equal to about 10:1, less than or equal to about 8:1, less than or equal to about 6:1, less than or equal to about 4:1, and greater than or equal to about 1:1, greater than or equal to about 2:1, greater than or equal to about 3:1, greater than or equal to about 9:1, or greater than or equal to about 10:1.

The second semiconductor nanocrystal shell may include ZnS. The second semiconductor nanocrystal shell may not include selenium. The second semiconductor nanocrystal shell may be disposed directly on the first semiconductor nanocrystal shell. A thickness of the second semiconductor nanocrystal shell may be selected appropriately. The second semiconductor nanocrystal shell may be the outermost layer of the quantum dot. In an embodiment, the quantum dot may have a core/multishell structure that includes a core comprising indium phosphide (e.g., InP or InZnP), the first semiconductor nanocrystal shell disposed directly on the core and including ZnSe, and the second semiconductor nanocrystal shell disposed directly on the first semiconductor nanocrystal shell and including ZnS.

In a green light emitting quantum dot, a molar ratio of the sulfur with respect to indium may be greater than or equal to about 5:1, greater than or equal to about 6:1, greater than or equal to about 7:1, and less than or equal to about 15:1, or less than or equal to about 12:1, or less than or equal to about 10:1.

In a red light emitting quantum dot, a molar ratio of the sulfur with respect to indium may be less than or equal to about 15:1, less than or equal to about 13:1, or less than or equal to about 12.5:1, less than or equal to about 10:1, less than or equal to about 9:1, less than or equal to about 8:1, less than or equal to about 7:1, less than or equal to about 6:1, less than or equal to about 5:1, and greater than or equal to about 1:1, greater than or equal to about 2:1, greater than or equal to about 6:1, greater than or equal to about 7:1, greater than or equal to about 8:1, or greater than or equal to about 9:1.

A display device based on the quantum dot may provide an improved display quality in terms of color purity, brightness, and the like. For example, a conventional liquid crystal display device (e.g., a conventional LCD device) is a device realizing color by polarized light that passes through a liquid crystal layer and a color filter, and has a problem of narrow viewing angle and lower brightness due to the low light transmittance of the absorptive color filter. The quantum dot has a theoretical quantum yield of about 100% and may emit light of high color purity (e.g., having a FWHM of less than or equal to about 40 nm), thereby realizing enhanced luminance efficiency and improved color purity. Thus, replacing the absorptive color filter with a photoluminescent type color filter including quantum dots may contribute a wider viewing angle and an increased brightness.

In order to be utilized in a device, however, the quantum dot may be in a form of a composite wherein a plurality of them are dispersed in a host matrix (e.g., including a polymer and/or inorganic material). A quantum dot polymer composite or a color filter including the same may provide a display device having high brightness, wide viewing angle, and high color purity. However, the weight of the quantum dot included in the composite may be limited for various reasons regarding a production process. Thus, developing a quantum dot exhibiting enhanced blue light absorption and increased brightness at the same time and having thermal stability is desired.

By having the aforementioned structure and the composition, the cadmium free quantum dot may have an improved quality of a shell coating and thereby a single entity of the cadmium free quantum dot may have a relatively reduced weight and show increased stability (e.g., thermal stability) and improved optical properties (e.g., quantum yield and blue light absorption). Thus, the number of the quantum dot constituting a predetermined weight may increase. Without wishing to be bound by any theory, it is believed that in the case of the quantum dot, a ZnSe layer having a predetermined thickness without an alloy layer (e.g., including ZnSeS) is formed on the core, and on the ZnSe layer, a ZnS layer of a predetermined thickness is formed and thereby the resulting quantum dot may exhibit improved stability and increased optical properties.

In an embodiment, the quantum dot may include an InP core and may emit red light and have a ratio of an amount of the indium and the chalcogen element within a predetermined range. For example, in the case of the quantum dot having a photoluminescent peak wavelength between about 600 nm and about 650 nm, a molar ratio of indium with respect to a sum of sulfur and selenium (In/(Se+S)) (hereinafter, a molar ratio of indium with respect to sulfur and selenium) may be greater than or equal to about 0.06:1, for example, greater than or equal to about 0.07:1, greater than or equal to about 0.08:1 greater than or equal to about 0.09:1, greater than or equal to about 0.1:1, greater than or equal to about 0.11:1, greater than or equal to about 0.12:1, greater than or equal to about 0.13:1, greater than or equal to about 0.14:1, greater than or equal to about 0.15:1, greater than or equal to about 0.16:1, greater than or equal to about 0.17:1, greater than or equal to about 0.18:1, greater than or equal to about 0.19:1, or greater than or equal to about 0.20:1, and less than or equal to about 0.3:1, less than or equal to about 0.29:1, less than or equal to about 0.28:1, less than or equal to about 0.27:1, less than or equal to about 0.26:1, less than or equal to about 0.25:1, or less than or equal to about 0.24:1, less than or equal to about 0.23:1, less than or equal to about 0.22:1. Without wishing to be bound by any theory, it is believed that the aforementioned range of the composition may contribute to increasing the optical properties and stability of the cadmium free quantum dot.

In an embodiment, the quantum dot may include an InZnP core and may emit green light and have a ratio of an amount of the indium and the chalcogen element within a predetermined range. For example, in the case of the quantum dot having a photoluminescent peak wavelength between about 500 nm and about 550 nm, a molar ratio of indium with respect to sulfur and selenium) may be greater than or equal to about 0.027:1, for example, greater than or equal to about 0.028:1, greater than or equal to about 0.029:1, greater than or equal to about 0.030:1, greater than or equal to about 0.035:1, greater than or equal to about 0.04:1, greater than or equal to about 0.041:1, greater than or equal to about 0.042:1, greater than or equal to about 0.043:1, greater than or equal to about 0.044:1, greater than or equal to about 0.045:1, greater than or equal to about 0.05:1, greater than or equal to about 0.055:1, or greater than or equal to about 0.06:1, and less than or equal to about 0.1:1, for example, less than or equal to about 0.09:1, less than or equal to about 0.08:1, less than or equal to about 0.07:1, less than or equal to about 0.069:1, less than or equal to about 0.068:1, less than or equal to about 0.067:1, less than or equal to about 0.066:1, less than or equal to about 0.065:1, less than or equal to about 0.064:1, less than or equal to about 0.063:1, less than or equal to about 0.062:1, less than or equal to about 0.061:1, less than or equal to about 0.06:1.

In an embodiment, the cadmium free quantum dot may have a blue light absorption per one gram of the quantum dot of greater than or equal to about 1, greater than or equal to about 1.1, greater than or equal to about 1.2, greater than or equal to about 1.3, greater than or equal to about 1.4, greater than or equal to about 1.5, greater than or equal to about 1.6, greater than or equal to about 1.7, greater than or equal to about 1.8, greater than or equal to about 1.9, or greater than or equal to about 2. Together with a relatively improved blue light absorption, the cadmium free quantum dot may exhibit enhanced luminous properties. For example, the cadmium free quantum dot may have a quantum yield of greater than or equal to about 80%, greater than or equal to about 81%, or greater than or equal to about 82% and a full width at half maximum of less than or equal to about 45 nm, for example, less than or equal to about 44 nm, less than or equal to about 43 nm, less than or equal to about 42 nm, or less than or equal to about 41 nm.

In the UV-Vis absorption spectrum of the cadmium free quantum dot, the first absorption peak may be present in a wavelength range of greater than or equal to about 450 nm and less than a photoluminescent peak wavelength of the cadmium free quantum dot. In an embodiment, a green light emitting quantum dot may have the first absorption peak wavelength that is for example, greater than or equal to about 480 nm, greater than or equal to about 485 nm, or greater than or equal to about 490 nm and less than or equal to about 520 nm, less than or equal to about 515 nm, or less than or equal to about 510 nm. In an embodiment, a red light emitting quantum dot may have the first absorption peak wavelength that is for example, greater than or equal to about 580 nm, greater than or equal to about 590 nm and less than or equal to about 620 nm, less than or equal to about 610 nm.

When the quantum dot emits red light or green light, a size thereof may be greater than or equal to about 1 nm, greater than or equal to about 2 nm, greater than or equal to about 3 nm, greater than or equal to about 4 nm, or greater than or equal to about 5 nm. When the quantum dot emits red light or green light, a size thereof may be less than or equal to about 30 nm, for example, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 15 nm, less than or equal to about 14 nm, less than or equal to about 13 nm, less than or equal to about 12 nm, less than or equal to about 11 nm, less than or equal to about 10 nm, less than or equal to about 9 nm, less than or equal to about 8 nm, or less than or equal to about 7 nm.

The size of the quantum dot may be a particle diameter, or in the case of a non-spherically shaped particle, a dimension calculated from a two dimensional area of a scanning electron microscopic (SEM) image of the particle.

The shape of the quantum dot is not particularly limited. For example, the shape of the quantum dot may include a sphere, a polyhedron, a pyramid, a multi-pod, a cubic, a rectangular parallelepiped, a nanotube, a nanowire, a nanofiber, a nanosheets, a nanorod, or a combination thereof, but is not limited thereto.

The quantum dot may include an organic ligand and/or an organic solvent on a surface thereof. The organic ligand and the organic solvent will be explained in detail below. The organic ligand and/or the organic solvent may be bound to a surface of the quantum dot.

An embodiment is directed to a method of producing the aforementioned cadmium free quantum dot, which includes:

providing a first mixture including a first shell precursor containing zinc, an organic ligand, and an organic solvent;

optionally heating the first mixture;

adding a semiconductor nanocrystal core including indium and phosphorous, and a selenium containing precursor (for example, as not being in a heated state) to the optionally heated first mixture to obtain a second mixture;

heating the second mixture to a first reaction temperature and keeping, e.g., maintaining, the second mixture at the first reaction temperature for a time period of greater than or equal to about 40 minutes (e.g., greater than or equal to about 50 minutes) to obtain a third mixture including a particle having a first semiconductor nanocrystal shell including zinc and selenium formed on the semiconductor nanocrystal core;

adding a sulfur containing precursor (e.g., a stock solution including the same) to the third mixture at the first reaction temperature to form a second semiconductor nanocrystal shell containing zinc and sulfur on the first semiconductor nanocrystal shell.

During the reaction, amounts the selenium containing precursor and the sulfur containing precursor with respect to the core (i.e., indium) and ratios therebetween in the second and third mixtures and optionally a reaction time at each of the steps are controlled such that when the resulting cadmium free quantum dot has a photoluminescent peak wavelength in a range from about 600 nm to about 650 nm, a molar ratio of indium with respect to a sum of sulfur and selenium (In/(Se+S)) is greater than or equal to about 0.06:1 and less than or equal to about 0.3:1, and when the resulting cadmium free quantum dot has a photoluminescent peak wavelength in a range from about 500 nm to about 550 nm, a molar ratio of indium with respect to a sum of sulfur and selenium (In/(Se+S)) is greater than or equal to about 0.027:1 and less than or equal to about 0.1:1.

On the injection of the core, the temperature of the first mixture may be greater than or equal to about 50° C., for example, greater than or equal to about 100° C., greater than or equal to about 120° C., greater than or equal to about 150° C., or greater than or equal to about 200° C.

The method may not include lowering a temperature of the third mixture to a temperature of less than or equal to about 100° C., e.g., less than or equal to about 50° C. (e.g., to a temperature of less than or equal to about 30° C.).

Details of the cadmium free quantum dots are the same as set forth above.

Types of the first shell precursor are not particularly limited and selected appropriately. In an embodiment, the first shell precursor may include a Zn metal powder, an alkylated Zn compound, Zn alkoxide, Zn carboxylate, Zn nitrate, Zn perchlorate, Zn sulfate, Zn acetylacetonate, Zn halide, zinc carbonate, Zn cyanide, Zn hydroxide, Zn oxide, Zn peroxide, or a combination thereof. Examples of the first shell precursor may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, and the like. One or more first shell precursors that can be the same or different may be used.

In an embodiment, the organic ligand may include $RCOOH$, $RNH_2$, $R_2NH$, $R_3N$, $RSH$, $RH_2PO$, $R_2HPO$, $R_3PO$, $RH_2P$, $R_2HP$, $R_3P$, $ROH$, $RCOOR'$, $RPO(OH)_2$, $RHPOOH$, $R_2POOH$ (wherein R and R' are the same or different, and are each independently a hydrogen, C1 to C40 aliphatic hydrocarbon group, such as C1 to C40 (e.g., C3 to C24) alkyl or C2 to C40 (e.g., C3 to C24) alkenyl group, C2 to C40 (e.g., C3 to C24) alkynyl group or a C6 to C40 aromatic hydrocarbon group such as a C6 to C20 aryl group), a polymeric organic ligand, or a combination thereof. The organic ligand may coordinate to the surface of the obtained nanocrystal, allowing the nanocrystal to be well dispersed in the solution and/or having an effect on the light emitting and electrical properties of the quantum dot.

Examples of the organic ligand compound may include:

a thiol compound such as methane thiol, ethane thiol, propane thiol, butane thiol, pentane thiol, hexane thiol, octane thiol, dodecane thiol, hexadecane thiol, octadecane thiol, benzyl thiol;

an amine compound such as methylamine, ethylamine, propylamine, butylamine, pentylamine, hexylamine, octylamine, nonylamine, decylamine, dodecylamine, hexadecylamine, octadecylamine, dimethylamine, diethylamine, dipropylamine, tributylamine, trioctylamine, or a combination thereof;

a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, or a combination thereof;

a phosphine compound such as methyl phosphine, ethyl phosphine, propyl phosphine, butyl phosphine, pentyl phosphine, octyl phosphine, dioctyl phosphine, tributyl phosphine, trioctyl phosphine, or a combination thereof;

a phosphine oxide compound such as methyl phosphine oxide, ethyl phosphine oxide, propyl phosphine oxide, butyl phosphine oxide, pentyl phosphine oxide, tributyl phosphine oxide, octylphosphine oxide, dioctyl phosphine oxide, trioctyl phosphine oxide, or a combination thereof;

diphenyl phosphine, triphenyl phosphine, or an oxide compound thereof, or a combination thereof;

a mono- or di(C5 to C20 alkyl)phosphinic acid such as mono- or dihexylphosphinic acid, mono- or dioctylphosphinic acid, mono- or didodecylphosphinic acid, mono- or di(tetradecyl)phosphinic acid, mono- or di(hexadecyl)phosphinic acid, mono- or di(octadecyl)phosphinic acid, or a combination thereof;

a C5 to C20 alkylphosphonic acid such as hexylphosphonic acid, octylphosphonic acid, dodecylphosphonic acid, tetradecylphosphonic acid, hexadecylphosphonic acid, octadecylphosphonic acid, or a combination thereof;

or a combination thereof.

Examples of the organic solvent may include a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, squalene, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) containing at least one (e.g., 1, 2, or 3) C6 to C22 alkyl group, a phosphine oxide (e.g., trioctylphosphine oxide) containing at least one (e.g., 1, 2, or 3) C6 to C22 alkyl group, a C12 to C22 aromatic ether such as a phenyl ether or a benzyl ether, or a combination thereof.

The first mixture may be heated to a temperature of greater than or equal to about 100° C., greater than or equal to about 120° C., greater than or equal to about 150° C., greater than or equal to about 200° C., greater than or equal to about 250° C., or greater than or equal to about 270° C., for example, under vacuum and/or an inert atmosphere for a predetermined time period (e.g., greater than or equal to about 5 minutes and less than or equal to about 1 hour (hr)).

Details of the semiconductor nanocrystal core including indium and phosphorous are the same as set forth above. The core may be commercially available or may be synthesized in a suitable method. A method of preparing the core is not particularly limited and a suitable method of producing an indium phosphide based core may be used. In an embodiment, the core may be formed by a hot injection manner wherein a solution including a metal precursor (e.g., an indium precursor) and optionally a ligand is heated to a high temperature (e.g., of greater than or equal to about 200° C.) and a phosphorous precursor is injected to the hot solution.

Types of the selenium containing precursor are not particularly limited and may be selected appropriately. For example, the selenium containing precursor may include selenium-trioctylphosphine (Se-TOP), selenium-tributylphosphine (Se-TBP), selenium-triphenylphosphine (Se-TPP), or a combination thereof, but is not limited thereto. The first reaction temperature may be greater than or equal to about 280° C., greater than or equal to about 290° C., greater than or equal to about 300° C., greater than or equal to about 310° C., or greater than or equal to about 315° C. and less than or equal to about 350° C., less than or equal to about 340° C., or less than or equal to about 330° C.

After or during the heating of the second mixture to the first reaction temperature, a selenium containing precursor may be injected at least one time (e.g., at least twice, at least third times). The second mixture may be kept at the first reaction temperature for a predetermined time period (e.g., of greater than or equal to about 40 minutes, for example, greater than or equal to about 50 minutes, greater than or equal to about 60 minutes, greater than or equal to about 70 minutes, greater than or equal to about 80 minutes, greater than or equal to about 90 minutes, and less than or equal to about 4 hours, for example, less than or equal to about 3 hours, less than or equal to about 2 hours) and thereby a first semiconductor nanocrystal shell including zinc and selenium may be formed to obtain a third mixture including a particle of the aforementioned shell on the core.

The second mixture is kept at the first reaction temperature for the time period of the aforementioned range to form the first semiconductor nanocrystal shell having a thickness of greater than or equal to about 3 ML. In this case, in the second mixture, the amount of the selenium precursor with respect to the indium may be controlled such that during the predetermined reaction time, the first semiconductor nanocrystal shell of the predetermined thickness is formed. In an embodiment, the amount of the selenium per one mole of indium may be greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles. In an embodiment, the amount of the selenium per one mole of indium may be less than or equal to about 20 moles, less than or equal to about 18 moles, or less than or equal to about 15 moles.

The third mixture may not include a selenium containing precursor.

At the first reaction temperature, a stock solution including a sulfur precursor may be added to the third mixture and thereby a second semiconductor nanocrystal shell is formed on the first semiconductor nanocrystal shell. The method may not include a step of decreasing the temperature of the third mixture to a temperature of less than or equal to about 100° C., e.g., less than or equal to about 50° C. (e.g., a temperature of 30° C. or lower or at room temperature).

Types of the sulfur containing precursor are not particularly limited and may be selected appropriately. The sulfur containing precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfide, ammonium sulfide, sodium sulfide, or a combination thereof. The sulfur containing precursor may be injected at least on time (e.g., at least twice).

In the first mixture, the second mixture, and the third mixture, each of the amounts of the selenium containing precursor and the sulfur containing precursor with respect to the indium may be selected considering the properties and types of the final quantum dot. In an embodiment, the amount of the sulfur per one mole of indium may be controlled in light of a desired value of In/(Se+S), reaction time, and the like. In an embodiment, the amount of sulfur with respect to one mole of indium in the third mixture may be greater than or equal to about 6 moles, greater than or equal to about 7 moles, greater than or equal to about 8 moles, greater than or equal to about 9 moles, greater than or equal to about 10 moles, greater than or equal to about 11 moles, greater than or equal to about 12 moles, greater than or equal to about 13 moles, greater than or equal to about 14 moles, greater than or equal to about 15 moles, greater than or equal to about 16 moles, greater than or equal to about 17 moles, greater than or equal to about 18 moles, greater than or equal to about 19 moles, or greater than or equal to about 20 moles. In an embodiment, the amount of sulfur with respect to one mole of indium in the third mixture may be less than or equal to about 45 moles, less than or equal to about 40 moles, or less than or equal to about 35 moles.

When the non-solvent is added into the obtained final reaction solution, the organic ligand-coordinated nanocrystal may be separated (e.g., precipitated). The non-solvent may be a polar solvent that is miscible with the solvent used in the reaction and nanocrystals are not dispersible therein. The non-solvent may be selected depending on the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, but is not limited thereto. The separation may be performed through a centrifugation, precipitation, chromatography, or distillation. The separated nanocrystal may be added to a washing solvent and washed, if desired. The washing solvent is not particularly limited and may include a solvent having a similar solubility parameter to that of the ligand and may, for example, include hexane, heptane, octane, chloroform, toluene, benzene, and the like.

In an embodiment, a quantum dot composition includes: (e.g., a plurality of) the aforementioned cadmium free quantum dot(s); a polymerizable (e.g., photopolymerizable)

monomer including a carbon-carbon double bond; and optionally a carboxylic acid group-containing binder; and optionally an initiator (e.g., a photoinitiator). The composition may further include an organic solvent and/or a liquid vehicle. The composition may be a photosensitive composition.

In the composition, details for the non-cadmium quantum dots are the same as set forth above. In the composition, the amount of the quantum dot may be selected appropriately in light of the types and amounts of other components in the composition and a final use thereof. In an embodiment, the amount of the quantum dot may be greater than or equal to about 1 wt %, for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a total solid content of the composition. The amount of the quantum dot may be less than or equal to about 70 wt %, for example, less than or equal to about 65 wt %, less than or equal to about 60 wt %, less than or equal to about 55 wt %, or less than or equal to about 50 wt %.

In the composition, the carboxylic acid group-containing binder may include:

a copolymer of a monomer combination including a first monomer, a second monomer, and optionally a third monomer, the first monomer having a carboxylic acid group and a carbon-carbon double bond, the second monomer having a carbon-carbon double bond and a hydrophobic moiety and not having a carboxylic acid group, and the third monomer having a carbon-carbon double bond and a hydrophilic moiety and not having a carboxylic acid group;

a multi-aromatic ring-containing polymer including a carboxylic acid group (—COOH) and having a backbone structure in a main chain (e.g., a backbone structure incorporated in the main chain), wherein the backbone structure includes a cyclic group including a quaternary carbon atom and two aromatic rings bound to the quaternary carbon atom;

or a combination thereof.

The copolymer may include a first repeating unit derived from the first monomer, a second repeating unit derived from the second monomer, and optionally, a third repeating unit derived from the third monomer.

The first repeating unit may include a unit represented by Chemical Formula 1-1, a unit represented by Chemical Formula 1-2, or a combination thereof:

Chemical Formula 1-1

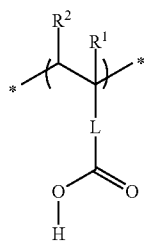

wherein, $R^1$ is hydrogen, a C1 to C3 alkyl group, or —$(CH_2)_n$—COOH (wherein n is 0 to 2), $R^2$ is hydrogen, a C1 to C3 alkyl group, or —COOH, L is a single bond, a C1 to C15 aliphatic hydrocarbon group such as a C1 to C3 alkylene group, a C6 to C30 aromatic hydrocarbon group such as a C6 to C12 arylene group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, and

* indicates a portion linked to an adjacent atom;

Chemical Formula 1-2

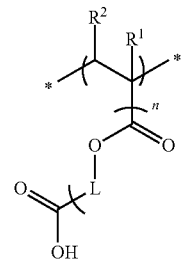

wherein, $R^1$ is hydrogen, a C1 to C3 alkyl group, or —$(CH_2)_m$—COOH (wherein m is 0 to 2), $R^2$ is hydrogen or a C1 to C3 alkyl group, L is a single bond, a C1 to C15 alkylene group, a C1 to C15 alkylene group wherein at least one methylene group is replaced with —C(=O)—, —O—, —C(=O)O—, or a combination thereof, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, n is an integer of 1 to 3, and

* indicates a portion linked to an adjacent atom.

As used herein, examples of the C6 to C30 alicyclic group include a cycloalkyl group such as a cyclohexyl group and a norbornyl group, a cycloalkenyl group such as a norbornenyl group, a cycloalkylene group such as a cyclohexylene group and a norbornylene group, and a cycloalkenylene group such as a cyclohexenylene group and a norbornenylene group, but are not limited thereto. As used herein, examples of the C6 to C30 aromatic hydrocarbon group includes a C6 to C30 aryl group such as a phenyl group, a naphthyl group, and the like, and a C6 to C30 arylene group such as a phenylene group, a naphthylene group, and the like, but are not limited thereto. As used herein, examples of the aliphatic hydrocarbon include for example C1 to C15 alkyl group and C1 to C15 alkylene group, but are not limited thereto.

The second repeating unit may include a unit represented by Chemical Formula 2-1, a unit represented by Chemical Formula 2-2, a unit represented by Chemical Formula 2-3, a unit represented by Chemical Formula 2-4, or a combination thereof:

Chemical Formula 2

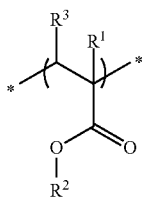

wherein, $R^1$ is hydrogen or a C1 to C3 alkyl group, $R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group (e.g., an arylalkyl group), $R^3$ is hydrogen or a C1 to C3 alkyl group, and

* indicates a portion linked to an adjacent atom;

Chemical Formula 2-2

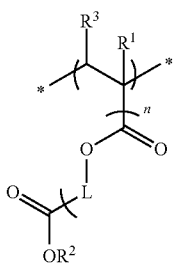

wherein, $R^1$ is hydrogen or a C1 to C3 alkyl group,

L is a C1 to C15 alkylene group, a C1 to C15 alkylene group wherein at least one methylene group is replaced with —C(=O)—, —O—, —C(=O)O—, or a combination thereof, a C6 to C30 aromatic hydrocarbon group such as C6 to C30 arylene group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, $R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, $R^3$ is hydrogen or a C1 to C3 alkyl group, n is an integer of 1 to 3, and

* indicates a portion linked to an adjacent atom;

Chemical Formula 2-3

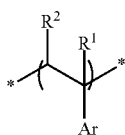

wherein, each of $R^1$ and $R^2$ is independently hydrogen or a C1 to C3 alkyl group, Ar is a substituted or unsubstituted C6 to C30 aromatic hydrocarbon group or a substituted or unsubstituted C3 to C30 alicyclic hydrocarbon group, and

* indicates a portion linked to an adjacent atom;

Chemical Formula 2-4

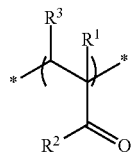

wherein, $R^1$ is hydrogen or a C1 to C3 alkyl group, $R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, $R^3$ is hydrogen or a C1 to C3 alkyl group, and

* indicates a portion linked to an adjacent atom.

The third repeating unit derived from the third monomer may be represented by Chemical Formula 3:

Chemical Formula 3

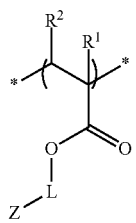

wherein in Chemical Formula 3, each of $R^1$ and $R^2$ is independently hydrogen or a C1 to C3 alkyl group, L is a C1 to C15 alkylene group, a C1 to C15 alkylene group wherein at least one methylene group is replaced with —C(=O)—, —O—, —C(=O)O—, or a combination thereof, a C6 to C30 aromatic hydrocarbon group such as a C6 to C30 arylene group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, Z is a hydroxyl group (—OH), a mercapto group (—SH), or an amino group (—NHR, wherein each R is independently hydrogen or a C1 to C5 alkyl group) and

* indicates a portion linked to an adjacent atom.

Examples of the first monomer may include, but are not limited to, acrylic acid, (meth)acrylic acid, maleic acid, itaconic acid, fumaric acid, 3-butenoic acid, and other carboxylic acid vinyl ester compounds. The first monomer may include one or more compounds.

Examples of the second monomer may include, but are not limited to:

alkenyl aromatic compounds such as styrene, α-methyl styrene, vinyl toluene, or vinyl benzyl methyl ether;

unsaturated carboxylic acid ester compounds such as methyl acrylate, methyl (meth)acrylate, ethyl acrylate, ethyl (meth)acrylate, butyl acrylate, butyl (meth)acrylate, benzyl acrylate, benzyl (meth)acrylate, cyclohexyl acrylate, cyclohexyl (meth)acrylate, phenyl acrylate, or phenyl (meth)acrylate;

unsaturated carboxylic acid amino alkyl ester compounds such as 2-amino ethyl acrylate, 2-amino ethyl (meth)acrylate, 2-dimethyl amino ethyl acrylate, or 2-dimethyl amino ethyl (meth)acrylate;

maleimides such as N-phenylmaleimide, N-benzylmaleimide, N-alkylmaleimide;

unsaturated carboxylic acid glycidyl ester compounds such as glycidyl acrylate or glycidyl (meth)acrylate;

vinyl cyanide compounds such as acrylonitrile or methacrylonitrile; and unsaturated amide compounds such as acrylamide or methacrylamide, but are not limited thereto.

As the second monomer, at least one compound may be used.

If present, examples of the third monomer may include 2-hydroxy ethyl acrylate, 2-hydroxy ethyl (meth)acrylate, hydroxy propyl acrylate, hydroxy propyl (meth)acrylate, hydroxy butyl acrylate, and hydroxy butyl (meth)acrylate, but are not limited thereto. The third monomer may include one or more compounds.

In an embodiment, in the binder copolymer, an amount of the first repeating unit derived from the first monomer may be greater than or equal to about 5 mole percent (mol %), for example, greater than or equal to about 10 mol %, greater than or equal to about 15 mol %, greater than or equal to about 25 mol %, or greater than or equal to about 35 mol %. In the binder copolymer, an amount of the first repeating unit may be less than or equal to about 95 mol %, for example, less than or equal to about 90 mol %, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the binder copolymer, an amount of the second repeating unit derived from the second monomer may be greater than or equal to about 5 mol %, for example, greater than or equal to about 10 mol %, greater than or equal to about 15 mol %, greater than or equal to about 25 mol %, or greater than or equal to about 35 mol %. In the binder copolymer, an amount of the second repeating unit may be less than or equal to about 95 mol %, for example, less than or equal to about 90 mol %, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the binder copolymer, an amount of the third repeating unit derived from the third monomer, when present, may be greater than or equal to about 1 mol %, for example, greater than or equal to about 5 mol %, greater than or equal to about 10 mol %, or greater than or equal to about 15 mol %. In the binder copolymer, an amount of the third repeating unit, when present, may be less than or equal to about 30 mol %, for example, less than or equal to about 25 mol %, less than or equal to about 20 mol %, less than or equal to about 18 mol %, less than or equal to about 15 mol %, or less than or equal to about 10 mol %.

In an embodiment, the carboxylic acid group-containing binder may include a copolymer of (meth)acrylic acid and at least one second or third monomer including an (C6-C9 aryl) or (C1-C10 alkyl) (meth)acrylate, hydroxyl(C1-C10 alkyl) (meth)acrylate, or styrene. For example, the binder polymer may include a (meth)acrylic acid/methyl (meth)acrylate copolymer, a (meth)acrylic acid/benzyl (meth)acrylate copolymer, a (meth)acrylic acid/benzyl (meth)acrylate/styrene copolymer, a (meth)acrylic acid/benzyl (meth)acrylate/2-hydroxy ethyl (meth)acrylate copolymer, a (meth)acrylic acid/benzyl (meth)acrylate/styrene/2-hydroxy ethyl (meth)acrylate copolymer, or a combination thereof.

In an embodiment, the carboxylic acid group containing binder may include a multi-aromatic ring-containing polymer. The multi-aromatic ring-containing polymer may include a carboxylic acid group (—COOH) and a main chain having a backbone structure incorporated therein, wherein the backbone structure includes a cyclic group including a quaternary carbon atom, which is a part of the cyclic group, and two aromatic rings bound to the quaternary carbon atom. The carboxylic acid group may be bonded to the main chain.

In the multi-aromatic ring-containing polymer, the backbone structure may include a repeating unit represented by Chemical Formula A'

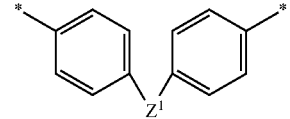

Chemical Formula A' wherein,

* indicates a portion that is linked to an adjacent atom in the main chain of the multi-aromatic ring-containing polymer, $Z^1$ is a linking moiety represented by any one of Chemical Formulae A-1 to A-6, and in Chemical Formulae A-1 to A-6, * indicates a portion that is linked to an adjacent atom in the aromatic ring:

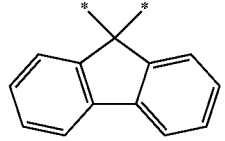

Chemical Formula A-1

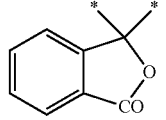

Chemical Formula A-2

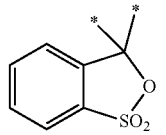

Chemical Formula A-3

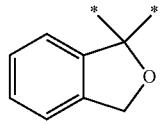

Chemical Formula A-4

Chemical Formula A-5

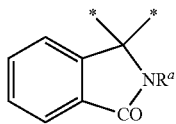

wherein $R^a$ is hydrogen, an ethyl group, $C_2H_4Cl$, $C_2H_4OH$, $CH_2CH{=}CH_2$, or a phenyl group, Chemical Formula A-6

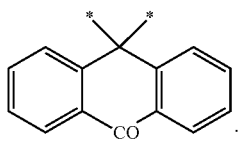

The multi-aromatic ring-containing polymer may include a structural unit represented by Chemical Formula B:

Chemical Formula B

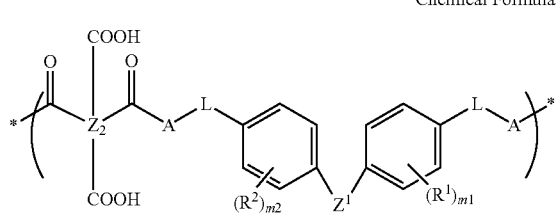

wherein, $Z^1$ is a linking moiety represented by any one of Chemical Formulae A-1 to A-6, each L is the same or different and each is independently a single bond, a C1 to C10 alkylene, a C1 to C10 alkylene having a substituent including a carbon-carbon double bond, a C1 to C10 oxyalkylene, or a C1 to C10 oxyalkylene having a substituent including a carbon-carbon double bond, each A is the same or different and each is independently —NH—, —O—, a C1 to C10 alkylene, or a combination thereof, $Z^2$ is a C6 to C40 aromatic hydrocarbon group, each of $R^1$ and $R^2$ is independently hydrogen, a halogen, or a substituted or unsubstituted C1 to C20 alkyl group, m1 and m2 are the same or different, and are independently an integer ranging from 0 to 4, and

* indicates a portion that is linked to an adjacent atom.

In Chemical Formula B, $Z^2$ may be Chemical Formula B-1, Chemical Formula B-2, or Chemical Formula B-3:

Chemical Formula B-1

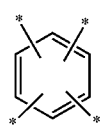

wherein * indicates a portion that is linked to an adjacent carbonyl carbon,

Chemical Formula B-2

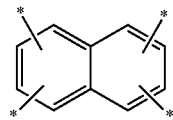

wherein * indicates a portion that is linked to an adjacent carbonyl carbon,

Chemical Formula B-3

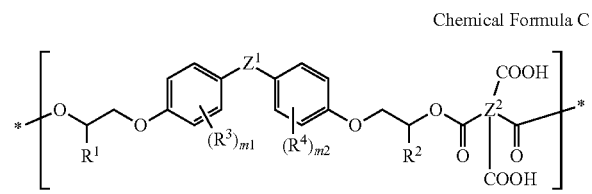

wherein,

* indicates a portion that is linked to an adjacent carbonyl carbon,

L is a single bond, —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —CR$_2$— (wherein each R is independently hydrogen, a C1 to O10 aliphatic hydrocarbon group, a C6 to C20 aromatic hydrocarbon group, or a C3 to C20 alicyclic hydrocarbon group), —C(CF$_3$)$_2$—, —C(CF$_3$)(O$_6$H$_5$)—, or —C(=O)NH—.

The multi-aromatic ring-containing polymer may include a structural unit represented by Chemical Formula C:

Chemical Formula C wherein, each of $R^1$ and $R^2$ is independently hydrogen or a substituted or unsubstituted (meth)acryloyloxyalkyl group, each of $R^3$ and $R^4$ is independently hydrogen, a halogen, or a substituted or unsubstituted C1 to C20 alkyl group, $Z^1$ is a linking moiety represented by any of Chemical Formulae A-1 to A-6, $Z^2$ is a C6 to C40 aromatic hydrocarbon group such as the moieties set forth above, m1 and m2 are the same or different, and are independently an integer ranging from 0 to 4, and

* indicates a portion that is linked to an adjacent atom.

In an embodiment, the multi-aromatic ring-containing polymer may be an acid adduct of a bisphenol fluorene epoxy acrylate monomer. For example, the bisphenol fluorene epoxy acrylate may be prepared by reacting 4,4-(9-fluorenylidene)-diphenol and epichlorohydrin to obtain an epoxy compound having a fluorene moiety, and the epoxy compound having a fluorene moiety is reacted with an acrylic acid to obtain a fluorenyl epoxy acrylate, which is then further reacted with biphenyl dianhydride and/or phthalic anhydride (e.g., tetrahydrophthalic anhydride). The aforementioned reaction scheme may be summarized as below:

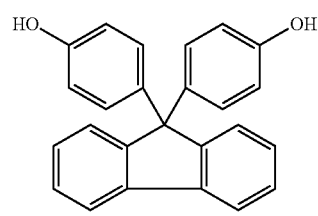
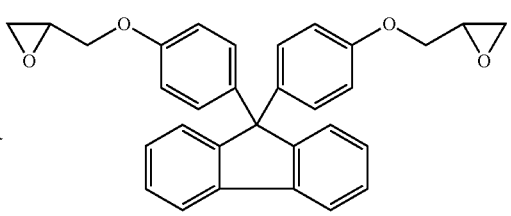
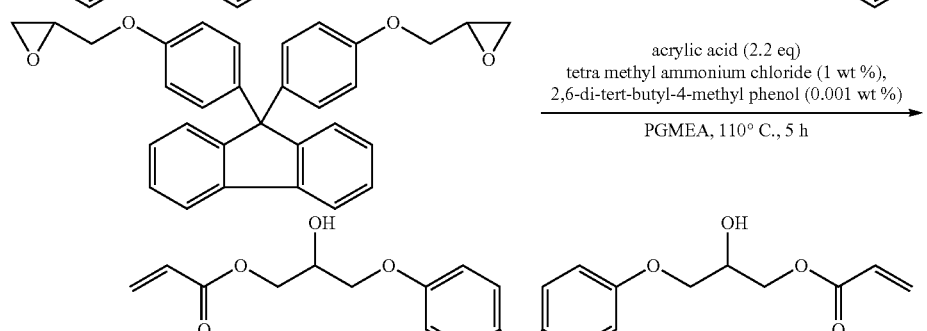
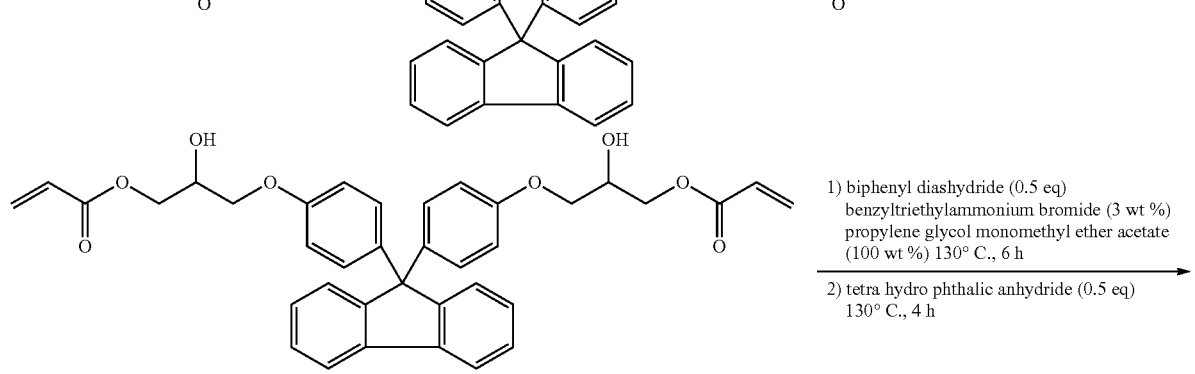
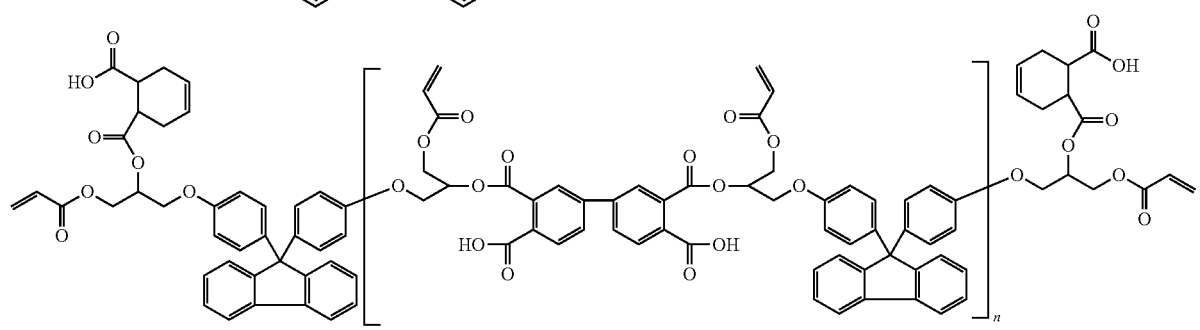

The multi-aromatic ring-containing polymer may include a functional group represented by Chemical Formula D at one or both terminal ends:

Chemical Formula D

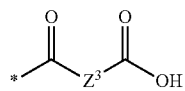

wherein in Chemical Formula E

* indicates a portion that is linked to an adjacent atom, and $Z^3$ is a moiety represented by one of Chemical Formulae D-1 to D-7:

Chemical Formula D-1

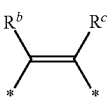

wherein, each of Rb and Re is independently hydrogen, a substituted or unsubstituted C1 to C20 alkyl group, a substituted or unsubstituted C1 to C20 alkyl group wherein at least one methylene is replaced with an ester group, an ether group, or a combination thereof, and

* indicates a portion that is linked to an adjacent atom;

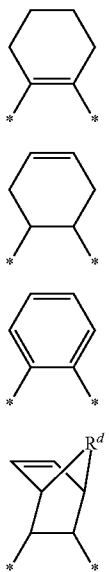

Chemical Formula D-2

Chemical Formula D-3

Chemical Formula D-4

Chemical Formula D-5 wherein $R^d$ is O, S, NH, a substituted or unsubstituted C1 to C20 alkylene group, a C1 to C20 alkylamine group, or a C2 to C20 alkenylamine group;

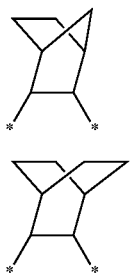

Chemical Formula D-6

Chemical Formula D-7

The multi-aromatic ring-containing polymer may be synthesized or commercially available (e.g., from Nippon Steel Chemical Co., Ltd.).

The multi-aromatic ring-containing polymer may include a structural unit derived from a reaction product of a fluorene compound such as 9,9-bis(4-hydroxyphenyl)fluorene, 9,9-bis(4-aminophenyl)fluorene, 9,9-bis[4-(glycidyloxy)phenyl]fluorene, 9,9-bis[4-(2-hydroxyethoxy)phenyl]fluorene, 9,9-bis-(3,4-dicarboxyphenyl)fluorene dianhydride, or a combination thereof, with an appropriate compound capable of reacting with the fluorene compound. The appropriate compound capable of reacting with the fluorene compound may include, but is not limited to, an aromatic dianhydride such as pyromellitic dianhydride (PMDA), biphenyltetracarboxylic dianhydride (BPDA), benzophenone tetracarboxylic dianhydride, and naphthalene tetracarboxylic dianhydride; a C2 to C30 diol compound; epichlorohydrin; or a combination thereof.

The fluorene compound, the dianhydrides, the diol compound, and the like are commercially available, and the reaction conditions therebetween may be determined by those of skill in the art without undue experimentation.

The carboxylic acid group-containing binder may have an acid value of greater than or equal to about 50 milligrams of potassium hydroxide (KOH) per gram (mg KOH/g). For example, the carboxylic acid group-containing binder may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g, but is not limited thereto. The carboxylic acid group-containing binder may have an acid value of less than or equal to about 250 mg KOH/g, for example, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto.

The quantum dots may be mixed with a solution of a binder having the acid value within the aforementioned range to provide a quantum dot-binder dispersion, the obtained quantum dot-binder dispersion may have the improved compatibility with the other components for the compositions (e.g., photopolymerizable monomer, photoinitiator, solvent, etc.), and thereby the quantum dots may be relatively uniformly dispersed in the final composition (e.g., photoresist composition).

The binder polymer (e.g., containing the carboxylic acid group, such as the carboxylic acid group-containing binder) may have a molecular weight of greater than or equal to about 1,000 grams per mole (g/mol), for example, greater than or equal to about 2,000 g/mol, greater than or equal to about 3,000 g/mol, or greater than or equal to about 5,000 g/mol. The binder polymer may have a molecular weight of less than or equal to about 100,000 g/mol, for example, less than or equal to about 50,000 g/mol.

In the composition, if present, an amount of the carboxylic acid group-containing binder may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on the total weight of the composition. In an embodiment, an amount of the carboxylic acid group-containing binder may less than or equal to about 50 wt %, less than or equal to about 40 wt %, less than or equal to about 35 wt %, less than or equal to about 33 wt %, or less than or equal to about 30 wt %, based on the total weight of the composition. The amount of the binder polymer may be greater than or equal to about 0.5 wt % and less than or equal to about 55%, based on a total solid content of the composition.

In the composition according to an embodiment, the (photo)polymerizable monomer having at least one (e.g., at least two, at least three, or more) carbon-carbon double bond may include a (meth)acrylate monomer. Examples of the photopolymerizable monomer may include, but are not limited to, C1-C10-alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy (meth)acrylate, bisphenol A di(meth)acrylate, trimethylolpropane tri(meth)acrylate, ethylene glycol monomethyl ether (meth)acrylate, novolac epoxy (meth)acrylate, propylene glycol di(meth)acrylate, tris(meth)acryloyloxyethyl phosphate, or a combination thereof.

The amount of the (photo)polymerizable monomer may be greater than or equal to about 0.5 wt %, for example, greater than or equal to about 1 wt %, or greater than or equal to about 2 wt % with respect to a total weight of the composition. The amount of the photopolymerizable monomer may be less than or equal to about 50 wt %, for example, less than or equal to about 40 wt %, less than or equal to about 30 wt %, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt % with respect to a total weight of the composition.

The (photo) initiator included in the composition may be a compound that can initiate a radical polymerization of the acrylate monomer and/or a thiol compound (e.g., by light). Types of the initiator are not particularly limited and may be selected appropriately. For example, the initiator may be a photo-initiator and may include a triazine compound, an acetophenone compound, a benzophenone compound, a thioxanthone compound, a benzoin compound, an oxime compound, an aminoketone compound, a phosphine or phosphine oxide compound, a carbazole compound, a diketone compound, a sulfonium borate compound, a diazo compound, a diimidazole compound, or a combination thereof, but it is not limited thereto.

Examples of the triazine compound may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxy phenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, 2,4-bis(trichloromethyl)-6-styryl-s-triazine, 2-(naphth-1-yl)-4,6-bis(trichloromethyl)-s-triazine, 2-(4-methoxynaphth-1-yl)-4,6-bis(trichloromethyl)-s-triazine, 2,4-bis(trichloromethyl)-6-(piperonyl)-s-triazine, 2,4-bis(trichloromethyl)-6-(4'-methoxy styryl)-s-triazine, or a combination thereof, but are not limited thereto.

Examples of the acetophenone compound may include 2,2'-diethoxyacetophenone, 2,2'-dibutoxyacetophenone, 2-hydroxy-2-methylpropiophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, or a combination thereof, but are not limited thereto.

Examples of the benzophenone compound may include benzophenone, benzoyl benzoate, methyl benzoyl benzoate, 4-phenylbenzophenone, hydroxybenzophenone, acrylated benzophenone, 4,4'-bis(dimethylamino)benzophenone, 4,4'-dichlorobenzophenone, 3,3'-dimethyl-2-methoxybenzophenone, or a combination thereof, but are not limited thereto.

Examples of the thioxanthone compound may include thioxanthone, 2-methylthioxanthone, 2-isopropylthioxanthone, 2,4-diethylthioxanthone, 2,4-diisopropylthioxanthone, 2-chlorothioxanthone, or a combination thereof, but are not limited thereto.

Examples of the benzoin compound may include benzoin, benzoin methyl ether, benzoin ethyl ether, benzoin isopropyl ether, benzoin isobutyl ether, benzyl dimethyl ketal, or a combination thereof, but are not limited thereto.

Examples of the oxime compound may include 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, or a combination thereof, but are not limited thereto.

As an alternative to, or in addition to the foregoing photoinitiators, a carbazole compound, a diketone compound, a sulfonium borate compound, an azo compound (e.g., diazo compound), a biimidazole compound, or a combination thereof may be used as a photoinitiator.

In the composition, an amount of the initiator may be adjusted in light of the types and the amount of the photopolymerizable monomer as used. In an embodiment, the amount of the initiator may be greater than or equal to about 0.01 wt % and less than or equal to about 10 wt % based on a total weight of the composition, but is not limited thereto.

The (photosensitive) composition may further include a thiol compound having at least one thiol group (e.g., monothiol or multi-thiol compound), a metal oxide particle, or a combination thereof.

The metal oxide fine particle may include $TiO_2$, $SiO_2$, $BaTiO_3$, $Ba_2TiO_4$, ZnO, or a combination thereof. An amount of the metal oxide fine particle may be less than or equal to about 15 wt %, based on a total solid content of the composition. A particle size of the metal oxide fine particle is not particularly limited and may be selected appropriately. The particle size of the metal oxide fine particle may greater than or equal to about 100 nm, greater than or equal to about 150 nm, or greater than or equal to about 200 nm and less than or equal to about 1,000 nm, less than or equal to about 900 nm, or less than or equal to about 800 nm.

The multi-thiol compound may include a compound represented by Chemical Formula 6:

Chemical Formula 6

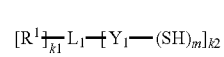

wherein $R^1$ includes hydrogen, a substituted or unsubstituted C1 to C40 (or C1 to C30) linear or branched alkyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C2 to C30 heterocycloalkyl group, a C1 to C10 alkoxy group, a hydroxy group, —$NH_2$, a substituted or unsubstituted C1 to C30 amine group (—NRR', wherein R and R' are the same or different, and are independently hydrogen or a C1 to C30 linear or branched alkyl group, and provided that R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide group (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are the same or different, and are independently hydrogen or a C1 to C20 linear or branched alkyl group), —C(=O)ONRR' (wherein R and R' are the same or different, and are independently hydrogen or a C1 to C20 linear or branched alkyl group), or a combination thereof, L$_1$ includes a carbon atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C2 to C30 heterocycloalkylene group, wherein at least one methylene (—CH$_2$—) of the substituted or unsubstituted C1 to C30 alkylene group or the substituted or unsubstituted C2 to C30 alkenylene group may be replaced by a sulfonyl group (—S($=$O)$_2$—), a carbonyl group (—C($=$O)—), an ether group (—O—), a sulfide group (—S—), a sulfoxide group (—S($=$O)—), an ester group (—C($=$O)O—), an amide group (—C($=$O)NR—) (wherein R is hydrogen or a C1 to C10 alkyl group), or a combination thereof, Y$_1$ includes a single bond, a substituted or unsubstituted C1 to C30 alkylene group, a substituted or unsubstituted C2 to C30 alkenylene group, or a substituted or unsubstituted C1 to C30 alkylene group or a substituted or unsubstituted C2 to C30 alkenylene group in which at least one methylene (—CH$_2$—) is replaced by a sulfonyl group (—S($=$O)$_2$—), a carbonyl group (—C($=$O)—), an ether group (—O—), a sulfide group (—S—), a sulfoxide group (—S($=$O)—), an ester group (—C($=$O)O—), an amide group (—C($=$O)NR—) (wherein R is hydrogen or a C1 to C10 linear or branched alkyl group), imine group (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that m does not exceed the valence of Y$_1$ when Y$_1$ is not a single bond, and provided that the sum of k1 and k2 does not exceed the valence of L$_1$.

The multi-thiol compound may include a compound of Chemical Formula 6-1:

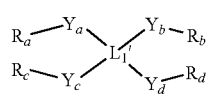

Chemical Formula 6-1 wherein in Chemical Formula 6-1,

L$_1$' is carbon, a substituted or unsubstituted C2 to C20 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, Y$_a$ to Y$_d$ are the same or different, and are independently a single bond, a substituted or unsubstituted C1 to C30 alkylene group, a substituted or unsubstituted C2 to C30 alkenylene group, or a substituted or unsubstituted C1 to C30 alkylene group or a substituted or unsubstituted C2 to C30 alkenylene group in which at least one methylene (—CH$_2$—) is replaced with a sulfonyl group (—S($=$O)$_2$—), a carbonyl group (—C($=$O)—), an ether group (—O—), a sulfide group (—S—), a sulfoxide group (—S($=$O)—), an ester group (—C($=$O)O—), an amide group (—C($=$O)NR—) (wherein R is hydrogen or a C1 to C10 linear or branched alkyl group), an imine group (—NR—) (wherein R is hydrogen or a C1 to C10 linear or branched alkyl group), or a combination thereof, and each of R$_a$ to R$_d$ is independently R$^1$ of Chemical Formula 6 or SH, provided that at least two of R$_a$ to R$_d$ are SH.

The multi-thiol compound may include a dithiol compound, a trithiol compound, a tetrathiol compound, or a combination thereof. For example, the multi-thiol compound may include glycol di-3-mercaptopropionate (e.g., ethylene glycol di-3-mercaptopropionate), glycol dimercaptoacetate (e.g., ethylene glycol dimercaptoacetate), tri methylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

Based on a total weight of the composition, an amount of the thiol compound may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %. The amount of the thiol compound may be greater than or equal to about 0.1 wt %, for example, greater than or equal to about 0.5 wt %, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, or greater than or equal to about 10 wt %, based on a total weight of the composition.

The composition may further include an organic solvent and/or a liquid vehicle. Types of the organic solvent and/or the liquid vehicle are not particularly limited. Types and amounts of the organic solvent may be appropriately selected by considering the aforementioned main components (i.e., the quantum dot, the COOH group-containing binder, the photopolymerizable monomer, the photoinitiator, and if used, the thiol compound), and types and amounts of additives which will be described later. The composition may include a solvent in a residual amount except for a desired amount of the solid content (non-volatile components). The solvent may be appropriately selected by considering the other components (e.g., a binder, a photopolymerizable monomer, a photoinitiator, and other additives) in the composition, affinity for an alkali-developing solution, a boiling point, and the like. Examples of the solvent and the liquid vehicle may include, but are not limited to: ethyl 3-ethoxy propionate; an ethylene glycol series such as ethylene glycol, diethylene glycol, or polyethylene glycol; a glycol ether such as ethylene glycol monomethyl ether, ethylene glycol monoethyl ether, diethylene glycol monomethyl ether, ethylene glycol diethyl ether, and diethylene glycol dimethyl ether; glycol ether acetates such as ethylene glycol monomethyl ether acetate, ethylene glycol monoethyl ether acetate, diethylene glycol monoethyl ether acetate, and diethylene glycol monobutyl ether acetate; a propylene glycol such as propylene glycol; a propylene glycol ether such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, and dipropylene glycol diethyl ether; a propylene glycol ether acetate such as propylene glycol monomethyl ether acetate and dipropylene glycol monoethyl ether acetate; an amide such as N-methylpyrrolidone, dimethyl formamide, and dimethyl acetamide; a ketone such as methyl ethyl ketone (MEK), methyl isobutyl ketone (MIBK), and cyclohexanone; a petroleum product such as toluene, xylene, and solvent naphtha; an ester such as ethyl acetate, propyl acetate, butyl acetate, cyclohexyl acetate, and ethyl lactate; an ether such as diethyl ether, dipropyl ether, and dibutyl ether; chloroform, a C1 to C40 aliphatic hydrocarbon (e.g., alkane, alkene, or alkyne), a halogen (e.g., chloro) substituted C1 to C40 aliphatic hydrocarbon (e.g., dichloroethane, trichloromethane, and the like), a C6 to C40 aromatic hydrocarbon (e.g., toluene, xylene, and the like), a halogen (e.g., chloro) substituted C6 to C40 aromatic hydrocarbon, or a combination thereof.

The composition may further include various additives such as a light diffusing agent, a leveling agent, or a coupling agent, in addition to the aforementioned components. The amount of the additive is not particularly limited, and may be selected within an appropriate range, wherein the additive does not cause an adverse effect on the preparation of the composition, the preparation of the quantum dot polymer composite, and optionally, the patterning of the composite.

The light diffusing agent may increase a refractive index of the composition in order to increase a chance of the incident light to meet with quantum dots. The light diffusing agent may include inorganic oxide particles such as alumina, silica, zirconia, titanium oxide or zinc oxide particulates, and metal particles such as gold, silver, copper, or platinum, but is not limited thereto.

The leveling agent may prevent stains or spots and may improve planarization and leveling characteristics of a film. Examples of the leveling agent may include the following but are not limited thereto.

For example, the leveling agent may include a fluorine-containing leveling agent and may include commercial products, for example BM-1000® and BM-1100® of BM Chemie Inc.; MEGAFACE F 142D®, F 172®, F 173®, and F 183® of Dainippon Ink Kagaku Kogyo Co., Ltd.; FC-135®, FC-1700®, FC-430®, and FC-431® of Sumitomo 3M Co., Ltd.; SURFLON S-112®, SURFLON S-113®, SURFLON S-131®, SURFLON S-141®, and SURFLON S-145® of Asahi Glass Co., Ltd.; and SH-28PA®, SH-190®, SH-193®, SZ-6032®, SF-8428®, and the like of Toray Silicone Co., Ltd.

The coupling agent may increase adhesion with respect to the substrate, and an example thereof may include a silane coupling agent. Examples of the silane coupling agent may be vinyl trimethoxysilane, vinyl tris(2-methoxyethoxysilane), 3-glycidoxypropyltrimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, 3-mercaptopropyltrimethoxysilane, or a combination thereof. Types and the amounts of the additive(s) may be adjusted, as desired.

If present, the amount of the additives may be, based on a total weight of the composition (or a solid content of the composition) greater than or equal to about 0.1 wt %, for example, greater than or equal to about 0.5 wt %, greater than or equal to about 1 wt %, greater than or equal to about 2 wt %, or greater than or equal to about 5 wt %, but it is not limited thereto. If present, the amount of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt %, but it is not limited thereto.

In an embodiment, the photosensitive composition may be prepared by a method that includes: preparing a quantum dot binder dispersion including the quantum dots, an organic solvent, and optionally the binder polymer (e.g., that may contain the carboxylic acid group (COOH)); and mixing the quantum dot binder dispersion with a photoinitiator, the photopolymerizable monomer (e.g., (meth) acrylate monomer), optionally the thiol compound, and optionally, a metal oxide fine particle, and optionally, at least one of the foregoing additives.

The quantum dot binder dispersion may be prepared by mixing a binder polymer solution with a quantum dot solution. The foregoing components may be mixed in any order or simultaneously, and the order of the mixing is not particularly limited.

The composition may provide a quantum dot polymer composite or a quantum dot pattern. Thus, in an embodiment, a quantum dot polymer composite may include a polymer matrix; and the aforementioned cadmium free quantum dots dispersed in the polymer matrix. The plurality of quantum dots and the plurality of luminous carbon nanoparticles are dispersed in the polymer matrix so as to be separate from each other.

The polymer matrix may include a binder polymer; a polymerization product of a photopolymerizable monomer including at least one (e.g., at least two, three, four, or five or more) carbon-carbon double bond (s), and optionally a polymerization product of the photopolymerizable monomer and a multi-thiol compound having at least two thiol groups at the terminal ends of the multi-thiol compound; or a combination thereof. In an embodiment, the polymer matrix may include a crosslinked polymer and optionally (a carboxylic acid group containing) binder polymer. The crosslinked polymer may include a thiolene polymer, a (meth) acrylate polymer, or a combination thereof. In an embodiment, the crosslinked polymer may include a polymerization product of the aforementioned photopolymerizable monomer and optionally the multi-thiol compound. Details of the binder polymer are the same as set forth above.

Details of the cadmium free quantum dot, the binder polymer, the photopolymerizable monomer, the multi-thiol compound are the same as set forth above.

A blue light absorption rate of the quantum dot polymer composite with respect to light having a wavelength of 450 nm may be greater than or equal to about 82%, for example, greater than or equal to about 83%, greater than or equal to about 84%, greater than or equal to about 85%, greater than or equal to about 86%, greater than or equal to about 87%, greater than or equal to about 88%, or greater than or equal to about 89%, for example when an amount of the cadmium free quantum dot is about 45% based on a total weight of the composite).

The quantum dot polymer composite may be in a form of a film or a sheet.

The film of the quantum dot polymer composite or a pattern thereof may have, for example, a thickness of less than or equal to about 30 μm, for example, less than or equal to about 10 μm, less than or equal to about 8 μm, or less than or equal to about 7 μm and greater than about 2 μm, for example, greater than or equal to about 3 μm, greater than or equal to about 3.5 μm, or greater than or equal to about 4 μm. The sheet may have a thickness of less than or equal to about 1000 μm, for example, less than or equal to about 900 μm, less than or equal to about 800 μm, less than or equal to about 700 μm, less than or equal to about 600 μm, less than or equal to about 500 μm, or less than or equal to about 400 μm. The sheet may have a thickness of greater than or equal to about 10 μm, greater than or equal to about 50 μm, or greater than or equal to about 100 μm.

The quantum dot polymer composite may exhibit improved thermal stability. Accordingly, the quantum dot polymer composite may exhibit photo-conversion efficiency (PCE) of greater than or equal to about 20% when heat-treated at about 180° C. for about 30 minutes under a nitrogen atmosphere.

In an embodiment, a display device includes a light source and a light emitting element (e.g., photoluminescent element), and the light emitting element includes the above quantum dot-polymer composite, and the light source is configured to provide the light emitting element with incident light. The incident light may have a photoluminescence peak wavelength of greater than or equal to about 440 nm, for example, greater than or equal to about 450 nm and less than or equal to about 460 nm.

In an embodiment, the light emitting element may include a sheet of the quantum dot polymer composite. The display device may further include a liquid crystal (LC) panel and the sheet of the quantum dot polymer composite may be disposed between the light source and the liquid crystal panel. FIG. 1 shows an exploded view of a display device. Referring to FIG. 1, the display device may have a structure wherein a reflector, a light guide panel (LGP) and a blue LED light source (Blue-LED), the quantum dot-polymer composite sheet (QD sheet), for example, various optical films such as a prism, double brightness enhance film (DBEF), and the like are stacked and a liquid crystal panel is disposed thereon.

In an embodiment, the display device may include a stacked structure including a (e.g., transparent) substrate and a light emitting layer (e.g., a photoluminescent layer) disposed on the substrate as a light emitting element. In the stacked structure, the light emitting layer includes a pattern of the quantum dot polymer composite, and the pattern may include at least one repeating section configured to emit light of a predetermined wavelength. The quantum dot polymer composite pattern may include at least one repeating section of a first section that may emit a first light and a second section that may emit a second light.

The first light and the second light have a different maximum photoluminescence peak wavelength in a photoluminescence spectrum. In an embodiment, the first light (R) may be red light present at a maximum photoluminescence peak wavelength of about 600 nm to about 650 nm (e.g., about 620 nm to about 650 nm), and the second light (G) may be green light present at a maximum photoluminescence peak wavelength of about 500 nm to about 550 nm (e.g., about 510 nm to about 550 nm).

The substrate may be a substrate including an insulation material. The substrate may include glass; various polymers such as a polyester (e.g., polyethylene terephthalate (PET), polyethylene naphthalate (PEN), and the like), polycarbonate, and poly(C1 to 10 alkyl) (meth)acrylate; polysiloxane (e.g., PDMS); an inorganic material such as $Al_2O_3$ or ZnO; or a combination thereof, but is not limited thereto. A thickness of the substrate may be desirably selected considering a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dot.

At least a portion of the substrate may be configured to cut (absorb or reflect) blue light. A layer capable of blocking (e.g., absorbing or reflecting) blue light, also referred to herein as "blue cut layer" or "blue light absorption layer," may be disposed on at least one surface of the substrate. For example, the blue cut layer (blue light absorption layer) may include an organic material and a predetermined dye, such as, for example, a yellow dye or a dye capable of absorbing blue light and transmitting green and/or red light.

In an embodiment, a method of producing the stacked structure includes forming a film of the above composition on a substrate;

exposing a selected region of the film to light (e.g., having a wavelength of less than or equal to about 400 nm); and developing the exposed film with an alkali developing solution to obtain a pattern of the quantum dot polymer composite.

The substrate and the composition have the same specification as described above.

Figure 2:
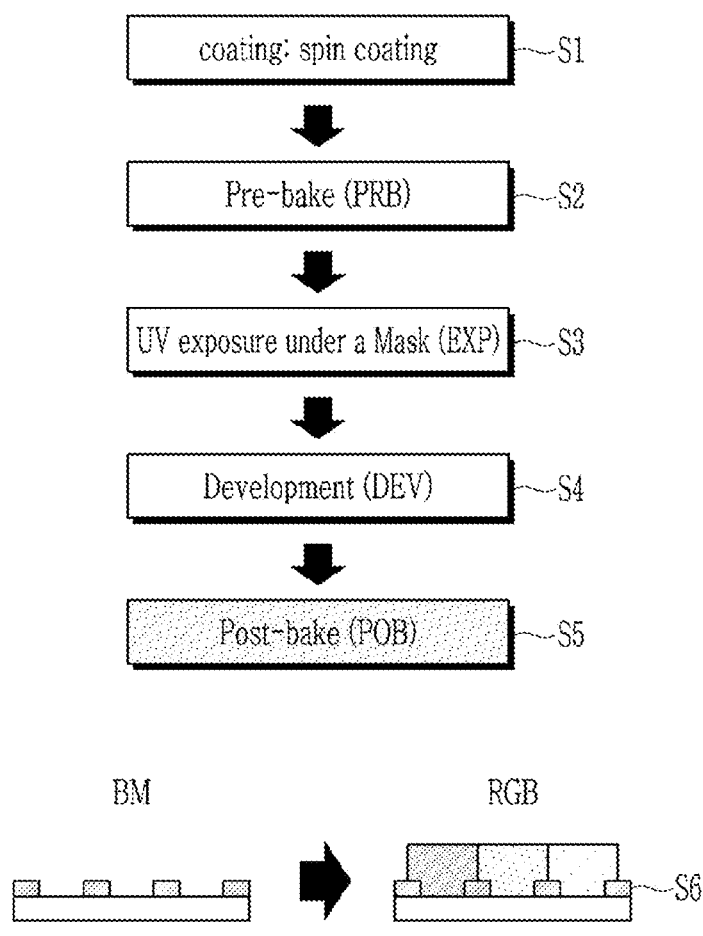
FIG. 2 is a view illustrating a process of producing a quantum dot polymer composite pattern using a composition according to an embodiment.

A method of forming a pattern of the quantum dot polymer composite is explained with reference to FIG. 2.

The composition is coated to have a predetermined thickness on a substrate in an appropriate method of spin coating, slit coating, and the like (S1). If desired, the formed film may be pre-baked (S2). Conditions (such as a temperature, a duration, and an atmosphere) for the pre-baking may be selected appropriately.

The formed (and optionally, pre-baked) film is exposed to light of a predetermined wavelength (UV light) under a mask having a predetermined pattern (S3). The wavelength and the intensity of light may be selected depending on the types and the amounts of the photoinitiator, the types and the amounts of quantum dots, or the like.

The film having the exposed selected area is treated (e.g., sprayed or immersed) with an alkali developing solution (S4), and thereby the unexposed region in the film is dissolved to provide a desired pattern. The obtained pattern may be post-baked (S5), if desired, to improve crack resistance and solvent resistance of the pattern, for example, at a temperature of about 150° C. to about 230° C. for a predetermined time, for example, greater than or equal to about 10 min or greater than or equal to about 20 min.

When the quantum dot-polymer composite pattern has a plurality of repeating sections, a quantum dot-polymer composite having a desired pattern may be obtained by preparing a plurality of compositions including a quantum dot (e.g., a red light emitting quantum dot, a green quantum dot, or optionally, a blue quantum dot) having desired photoluminescence properties (a photoluminescence peak wavelength and the like) to form each repeating section and repeating the pattern formation process for each of the composition as many times (e.g., twice or more or three times or more) as required to form a desired pattern of the quantum dot polymer composite (S6).

In an embodiment, an ink composition of an embodiment including the cadmium free quantum dot may be used to form a pattern. For example, a pattern may be formed by depositing the ink including nanomaterials (e.g., plurality of cadmium free quantum dots) and a liquid vehicle and a monomer on a desired region of a substrate and optionally removing the liquid vehicle and/or conducting a polymerization.

For example, the quantum dot-polymer composite may be in the form of a pattern of at least two different repeating color sections (e.g., RGB sections). Such a quantum dot-polymer composite pattern may be used as a photoluminescence-type color filter in a display device.

In other embodiments, a display device includes a light source and a light emitting element including a stacked structure.

The light source may be configured to provide incident light to the light emitting element including the layered structure. The incident light may have a wavelength of about 440 nm to about 480 nm such as about 440 nm to about 470 nm. The incident light may be the third light.

In a display device including the stacked structure, the light source may include a plurality of light emitting units respectively corresponding to the first section and the second section, and the light emitting units may include a first electrode and a second electrode facing each other and an electroluminescent layer disposed between the first electrode and the second electrode. The electroluminescent layer may include an organic light emitting material.

For example, each light emitting unit of the light source may include an electroluminescent device (e.g., an organic light emitting diode (OLED)) structured to emit light of a predetermined wavelength (e.g., blue light, green light, or a combination thereof). Structures and materials of the electroluminescent device and the organic light emitting diode (OLED) are not particularly limited.

Figure 3A:
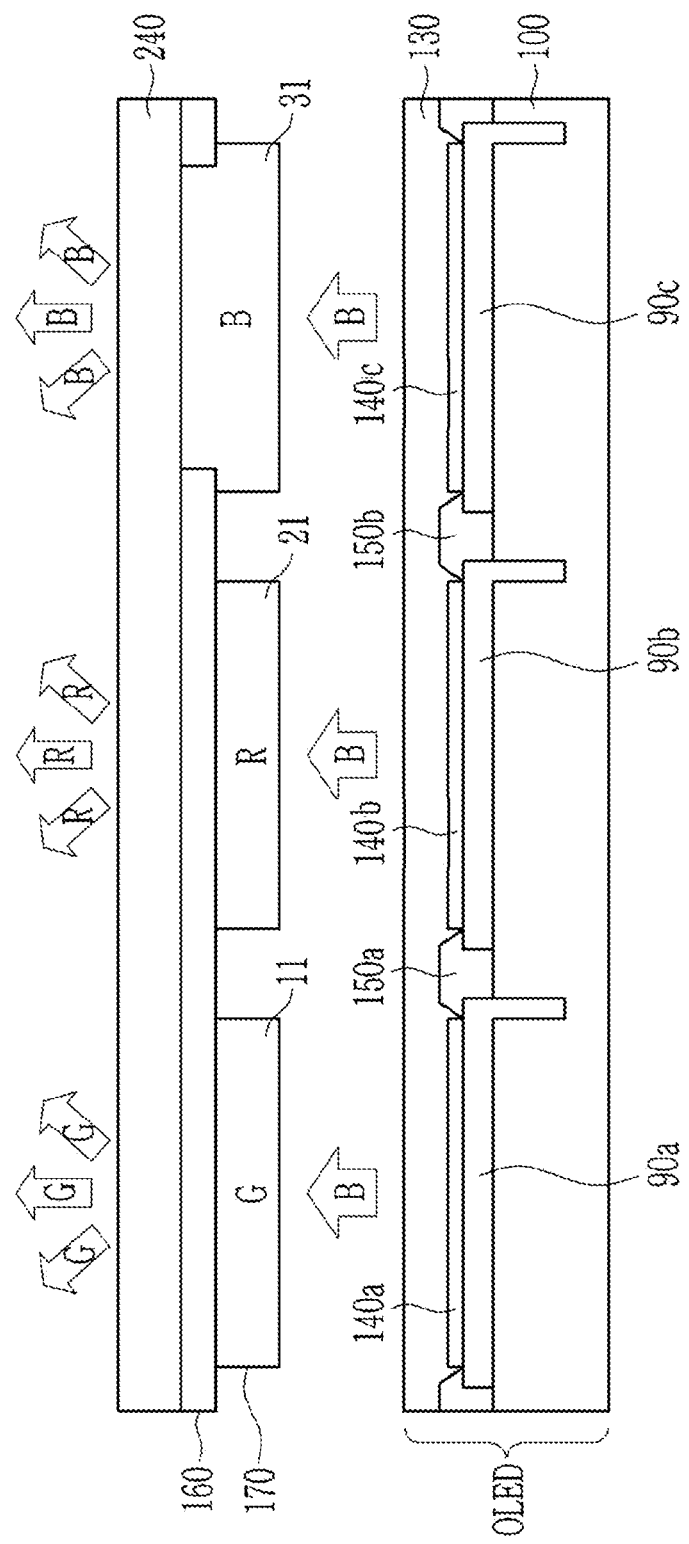
FIG. 3A is a cross-sectional view of a device according to an embodiment.
Figure 3B:
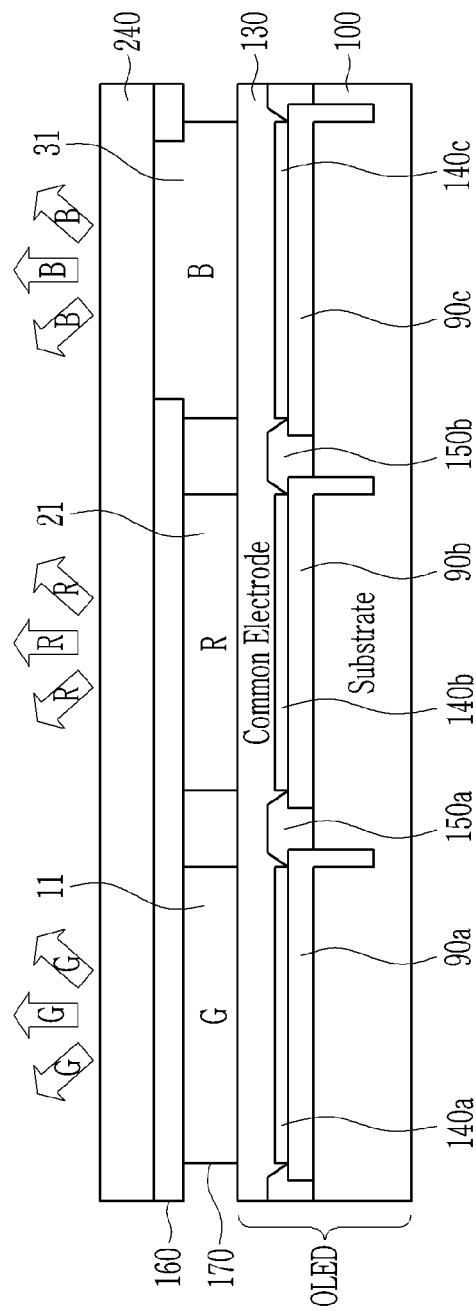
FIG. 3B is a cross-sectional view of a device according to an embodiment.

FIG. 3A and FIG. 3B show a schematic cross-sectional view of a display of an embodiment of a layered structure. Referring to FIG. 3A and FIG. 3B, the light source may include an organic light emitting diode OLED. For example, the OLED may emit blue light or a light having a wavelength in a region of about 500 nm or less. The organic light emitting diode OLED may include (at least two) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140b, 140c.

A thin film transistor and a substrate may be disposed under the organic light emitting diode. The pixel areas of the OLED may be disposed corresponding to the first, second, and third sections that will be described in detail below, respectively.

The layered structure that includes a quantum dot-polymer composite pattern (e.g., including a first repeating section including green light emitting quantum dots and/or a second repeating section including red light emitting quantum dots) and a substrate, or the quantum dot-polymer composite pattern, may be disposed on or over a light source, for example, directly on the light source.

The light (e.g., blue light) emitted from the light source may enter the second section 21 and the first section 11 of the pattern 170 to emit (e.g., converted) red light R and green light G, respectively. The blue light B emitted from the light source passes through or transmits from the third section 31. Over the second section 21 emitting red light and/or the first section 11 emitting green light, an optical element 160 may be disposed. The optical element may be a blue cut layer which cuts (e.g., reflects or absorbs) blue light and optionally green light, or a first optical filter. The blue cut layer 160 may be disposed on the upper substrate 240. The blue cut layer 160 may be disposed between the upper substrate 240 and the quantum dot-polymer composite pattern and over the first section 11 and the second section 21. Details of the blue cut layer are the same as set forth for the first optical filter 310 below.

The aforementioned device may be fabricated by separately preparing the layered structure and the OLED (for example, the blue OLED), respectively, and combining them. Alternatively, the device may be fabricated by directly forming the pattern of the quantum dot-polymer composite over the OLED.

In an embodiment, the display device may further include a lower substrate 210, an optical element (e.g., polarizer) 300 disposed below the lower substrate 210, and a liquid crystal layer 220 interposed between the layered structure and the lower substrate 210. The layered structure may be disposed in such a manner that a light emitting layer (i.e., the quantum dot-polymer composite pattern) faces the liquid crystal layer. The display device may further include an optical element (e.g., polarizer) 300 between the liquid crystal layer 220 and the light emitting layer. The light source may further include an LED and optionally a light guide panel.

Figure 4:
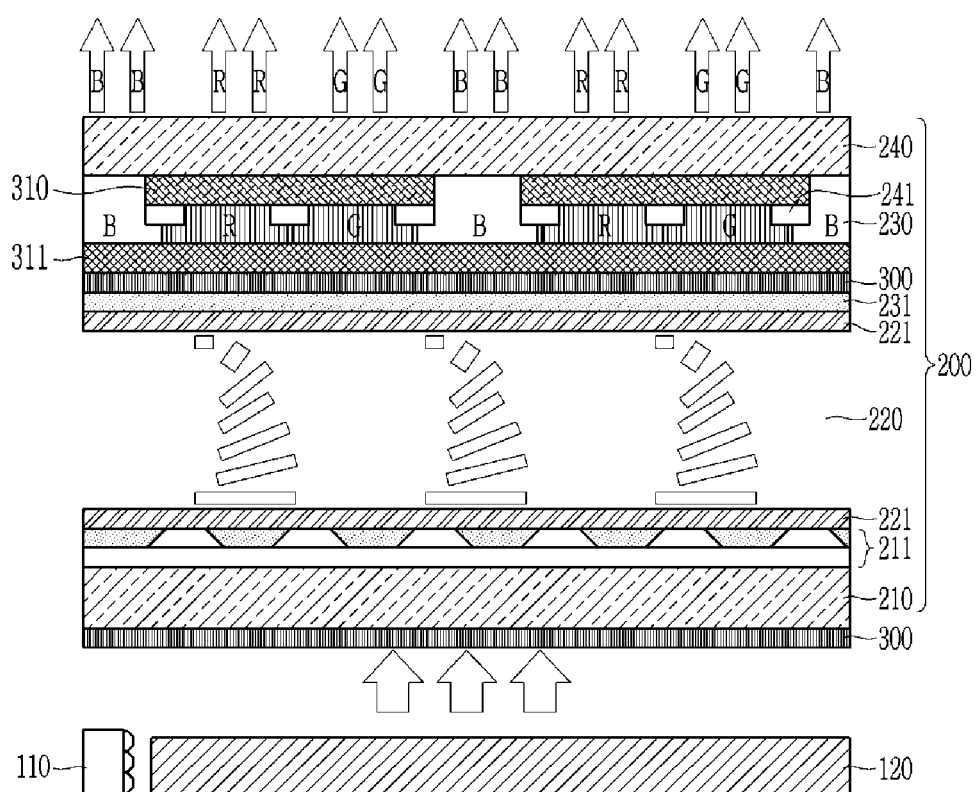
FIG. 4 is a cross-sectional view of a device according to yet an embodiment.

Referring to FIG. 4, in an embodiment, the display device includes a liquid crystal panel 200, an optical element 300 (e.g., polarizer) disposed on and/or under the liquid crystal panel 200, and a backlight unit including a blue light emitting light source 110 under a lower optical element 300. The backlight unit may include a light source 110 and a light guide 120 (edge type). Alternatively, the backlight unit may be a direct light source without a light guide panel (not shown). The liquid crystal panel 200 may include a lower substrate 210, an upper substrate 240, and a liquid crystal layer 220 between the upper and lower substrates, and a light emitting layer (color filter layer) 230 disposed on or under the upper substrate 240. The light emitting layer 230 may include the quantum dot-polymer composite (or a pattern thereof).

A wire plate 211 is provided on an internal surface, for example, on the upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 220 may be disposed on the wire plate 211. The liquid crystal layer 220 may include an alignment layer 221 on an upper surface of the liquid crystal layer 220 and on a lower surface of the liquid crystal layer 220, to initially align the liquid crystal material included therein. Details regarding a liquid crystal material, an alignment layer material, a method of forming an alignment layer, a method of forming a liquid crystal layer, a thickness of liquid crystal layer, or the like are not particularly limited.

In an embodiment, an upper optical element or an upper polarizer 300 may be provided between the liquid crystal layer 220 and the upper substrate 240, but it is not limited thereto. For example, the upper optical element or polarizer 300 may be disposed between the liquid crystal layer 220 (or a common electrode 231) and the light emitting layer (or the quantum dot-polymer composite pattern). A black matrix 241 may be provided under the upper substrate 240 (e.g., on a lower surface thereof). Openings within the black matrix 241 are aligned with a gate line, a data line, and a thin film transistor of a wire plate 211 on the lower substrate 210. A second section (R) including a color filter emitting red light, a first section (G) including a color filter emitting green light and/or a third section (B) including a color filter for emitting or transmitting blue light may be disposed in the openings within the black matrix 241 (BM). For example, the black matrix 241 may have a lattice shape. If desired, the light emitting layer may further include at least one of a fourth repeating section. The fourth section may be configured to emit light having a color (e.g., cyan, magenta, yellow, or the like) different from the colors of the light emitted from the first to third sections.

The light emitting layer (color filter layer) 230 may be on a transparent common electrode 231.

If desired, the display device may further include a blue cut filter, hereinafter, also referred to as a first optical filter layer. The first optical filter layer 310 may be disposed between upper surfaces of the second section (R) and the first section (G) and the lower surface of the upper substrate 240, or on an upper surface of the upper substrate (240). The first optical filter layer 310 may include a sheet having openings that correspond to the third section (B) (e.g., a pixel area showing, e.g., emitting, a blue color) and may be formed on portions corresponding to the first and second sections (G, R). The first optical filter layer 310 may be formed as a single body structure over the portions of the light emitting layer 230 corresponding to the first and second sections (G, R), and which are other than the portions overlapping the third section, but is not limited thereto. Alternatively, at least two first optical filter layers may be spaced apart from each other and may be disposed over each of the portions overlapping the first and the second sections, respectively.

For example, the first optical filter layer may block light having a predetermined wavelength range in the visible light range and may transmit light having another wavelength range. For example, the first optical filter layer may block blue light and transmit light other than blue light. For example, the first optical filter layer may transmit green light, red light, or yellow light (e.g., the mixed light of the green light and the red light).

The first optical filter layer may include a polymer thin film including a dye and/or a pigment that absorbs light having a specific wavelength, i.e., the wavelength to be blocked. The first optical filter layer may block at least 80%, or at least 90%, even at least 95% of blue light having a wavelength of less than or equal to about 480 nm. With respect to the visible light having other wavelengths, the first optical filter layer may have a light transmittance of greater than or equal to about 70%, for example, greater than or equal to about 80%, greater than or equal to about 90%, or even up to 100%.

The first optical filter layer may absorb and substantially block blue light having a wavelength of less than or equal to about 500 nm, and for example, may selectively transmit green light or red light. In this case, at least two first optical filter layers may be spaced apart and disposed on each of the portions overlapping the first and second sections, respectively. For example, the first optical filter layer selectively transmitting red light may be disposed on the portion overlapping the section emitting red light and the first optical filter layer selectively transmitting green light may be disposed on the portion overlapping the section emitting green light.

In an embodiment, the first optical filter layer may include at least one of a first region and a second region. The first region of the first optical filter layer blocks (e.g., absorbs) blue light and red light and transmits light having a wavelength of a predetermined range, e.g., a wavelength greater than or equal to about 500 nm, greater than or equal to about 510 nm, or greater than or equal to about 515 nm, and less than or equal to about 550 nm, less than or equal to about 540 nm, less than or equal to about 535 nm, less than or equal to about 530 nm, less than or equal to about 525 nm, or less than or equal to about 520 nm. The second region of the first optical filter layer blocks (e.g., absorb) blue light and green light and transmits light having a wavelength of a predetermined range, e.g., a wavelength of greater than or equal to about 600 nm, greater than or equal to about 610 nm, or greater than or equal to about 615 nm and less than or equal to about 650 nm, less than or equal to about 640 nm, less than or equal to about 635 nm, less than or equal to about 630 nm, less than or equal to about 625 nm, or less than or equal to about 620 nm. The first region of the first optical filter layer may be disposed (directly) on or over a location overlapping a green light emitting section and the second region of the first optical filter layer may be disposed (directly) on or over a location overlapping a red light emitting section. The first region and the second region may be optically isolated from one another, for example, by a black matrix. The first optical filter layer may contribute to improving the color purity of a display device.

The first optical filter layer may be a reflection type filter including a plurality of layers (e.g., inorganic material layers) each having a different refractive index. For example, in the first optical layer, two layers having different refractive indices may be alternately stacked on each other. For example, a layer having a high refractive index and a layer having a low refractive index may be alternately laminated with each other.

The display device may further include a second optical filter layer 311 (e.g., red/green light or yellow light recycling layer) that is disposed between the light emitting layer 230 and the liquid crystal layer 220, and between the light emitting layer 230—(e.g., the quantum dot polymer composite layer) and the upper polarizer 300. The second optical filter layer 311 may transmit at least a portion of a third light, and reflect at least a portion of a first light and/or a second light. The second optical filter layer may reflect light having a wavelength of greater than 500 nm. The first light may be green (or red) light, the second light may be red (or green) light, and the third light may be blue light.

The display device may exhibit improved luminance (e.g., greater than or equal to about 100 nits (candelas per square meter)) and a wide viewing angle (e.g., greater than or equal to about 160° C.).

An embodiment provides an electronic device including the quantum dot. The device may include a light emitting diode (LED), an organic light emitting diode (OLED), a sensor, a solar cell, an imaging sensor, or a liquid crystal display (LCD), but is not limited thereto.

Hereinafter, embodiments are illustrated in more detail with reference to examples. However, the present disclosure is not limited thereto.

EXAMPLES

Analysis Method
1. Ultraviolet-Visible (UV-Vis) Absorption Analysis

Agilent Cary5000 spectrometer is used to perform an ultraviolet (UV) spectroscopy analysis and UV-Visible absorption spectrum is obtained.

2. Photoluminescence Analysis

Photoluminescence Analysis is made by using Hitachi F-7000 spectrometer and a photoluminescence spectrum is obtained.

3. Quantum Yield (QY) of the Quantum Dot

A quantum yield is obtained by dividing the number of the photons emitted from the sample by the number of the photons absorbed by the sample. It is measured by using HAMAMATSU-Quantaurus-QY, C11347 (purchased from Hamamatsu Co., Ltd.) with respect to a quantum dot containing composition or a quantum dot polymer composite.

4. ICP Analysis

An inductively coupled plasma-atomic emission spectroscopy (ICP-AES) analysis is performed using Shimadzu ICPS-8100.

5. Blue Light Absorption Rate Per a Gram of the Quantum Dot

A predetermined weight of quantum dots is diluted with 100 times (the predetermined weight) of a toluene solvent to obtain a quantum dot solution, for which a UV-Vis absorption spectroscopic analysis is carried out by using the UV spectrometer (Agilent Cary5000 spectrometer). From the obtained spectrum, an absorption value at a wavelength of 450 nanometers (nm) (450 nm OD) is measured and is divided by the predetermined weight of the quantum dot to obtain a blue light absorption rate per a gram of the quantum dot.

6. Blue Light Absorption Rate and Conversion Efficiency of the Composite

Using an integrating sphere, a light dose of the blue excitation light (B) is measured. Then, a quantum dot polymer composite is placed in the integrating sphere and is irradiated the blue excitation light. A light dose of green (or red) light emitted from the composite (A) and a light dose of blue light passing through the composite (B') are measured. From the measured values, a blue light absorption rate and the photoconversion efficiency are calculated by the following equations:

$$\text{blue light absorption rate} = (B-B')/B \times 100\%$$

$$\text{photoconversion efficiency} = A/(B-B')$$

Production of InP and InZnP Cores

Reference Example 1: InP Cores are Prepared in the Following Manner

Indium acetate and palmitic acid are dissolved in 1-octadecene in a 200 milliliters (mL) reaction flask, subjected to a vacuum state at 120° C. for one hour. A molar ratio of indium to palmitic acid is 1:3. The atmosphere in the flask is exchanged with $N_2$. After the reaction flask is heated to 280° C., a mixed solution of tris(trimethylsilyl)phosphine ($TMS_3P$) and trioctylphosphine (TOP) is quickly injected, and the reaction proceeds for a predetermined time (e.g., for 20 minutes). The reaction mixture then is rapidly cooled to room temperature and acetone is added thereto to produce nanocrystals, which are then separated by centrifugation and dispersed in toluene to obtain a toluene dispersion of the InP core nanocrystals. The amount of the $TMS_3P$ is about 0.5 moles per one mole of indium. A size of the InP core thus obtained is about 3 nm.

Reference Example 2: InZnP Cores are Prepared in the Following Manner

An InZnP core is prepared in the same manner as set forth in Reference Example 1 except that Zinc acetate is further used in an amount of one mole per one mole of the indium precursor. A size of the InZnP core thus obtained is about 2 nm.

Red Quantum dots

Example 1

1. Synthesis of Quantum Dots and Characterization Thereof (1) Selenium and sulfur are dispersed in trioctylphosphine (TOP) to obtain a Se/TOP stock solution and a S/TOP stock solution, respectively.

In a 200 mL reaction flask, zinc acetate and oleic acid are dissolved in trioctyl amine and the solution is subjected to vacuum at 120° C. for 10 minutes. The atmosphere in the flask is replaced with $N_2$. While the resulting solution is heated to about 320° C., a toluene dispersion of the InP semiconductor nanocrystal core is injected thereto and a predetermined amount of Se/TOP stock solution is injected into the reaction flask over three times. A reaction is carried out to obtain a reaction solution including a particle having a ZnSe shell disposed on the InP core. A total of reaction time is 80 minutes and a total amount of the Se as used per one mole of the indium is about 4 moles.

Then, at the aforementioned reaction temperature, the S/TOP stock solution is injected to the reaction mixture. A reaction is carried out to obtain a resulting solution including a particle having a ZnS shell disposed on the ZnSe shell. A total of reaction time is 80 minutes and a total amount of the S as used per one mole of the indium is about 9 moles.

An excess amount of ethanol is added to the final reaction mixture including the resulting InP/ZnSe/ZnS semiconductor nanocrystals, which is then centrifuged. After centrifugation, the supernatant is discarded and the precipitate is dried and dispersed in chloroform to obtain a quantum dot solution (hereinafter, QD solution).

(2) For the obtained QD solution, an ICP-AES analysis is made and the results are shown in Table 1. A UV-vis absorption spectroscopic analysis and a photoluminescence spectroscopic analysis are made for the QD solution, and the results are shown in Table 2.

2. Production of a Quantum Dot Polymer Composite and a Pattern Thereof (1) Preparation of Quantum Dot-Binder Dispersion A chloroform solution of the quantum dots prepared above is mixed with a solution of a binder polymer, which is a four membered copolymer of methacrylic acid, benzyl methacrylate, hydroxyethyl methacrylate, and styrene, (acid value: 130 milligrams (mg) per gram of KOH (mg KOH/g), molecular weight: 8,000 g/mol, acrylic acid:benzyl methacrylate:hydroxyethyl methacrylate:styrene (molar ratio)=61.5:12:16.3:10.2) (solvent:propylene glycol monomethyl ether acetate, PGMEA, a concentration of 30 percent by weight, wt %) to form a quantum dot-binder dispersion.

(2) Preparation of a Photosensitive Composition

To the quantum dot-binder dispersion prepared above, a hexaacrylate having the following structure (as a photopolymerizable monomer), ethylene glycol di-3-mercaptopropionate (hereinafter, 2T, as a multi-thiol compound), an oxime ester compound (as an initiator), $TiO_2$ as a metal oxide fine particle, and PGMEA (as a solvent) are added to obtain a composition.

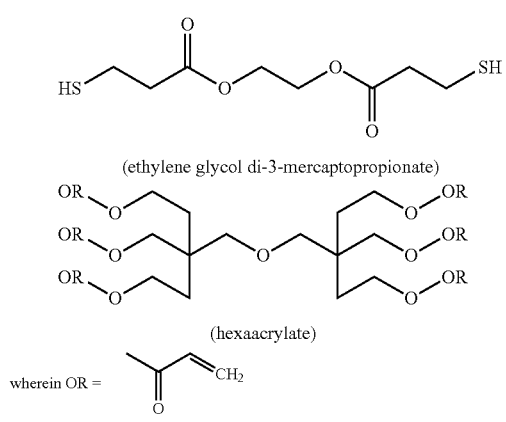

Based on a total solid content, the prepared composition includes 40 wt % of quantum dots, 12.5 wt % of the binder polymer, 25 wt % of 2T, 12 wt % of the photopolymerizable monomer, 0.5 wt % of the photoinitiator, and 10 wt % of the metal oxide fine particle. The total solid content is about 25%.

(3) Formation of Quantum Dot-Polymer Composite Pattern and Heat Treatment Thereof The composition obtained above is spin-coated on a glass substrate at 150 revolutions per minute (rpm) for 5 seconds (s) to provide a film. The obtained film is pre-baked at 100° C. (PRB). The pre-baked film is exposed to light (wavelength: 365 nanometers (nm), intensity: 100 millijoules, mJ) under a mask having a predetermined pattern (e.g., a square dot or stripe pattern) for 1 second (s) (EXP) and developed with a potassium hydroxide aqueous solution (conc.: 0.043%) for 50 seconds to obtain a pattern of a quantum dot polymer composite (thickness: 6 μm).

The obtained pattern is heat-treated at a temperature of 180° C. for 30 minutes under a nitrogen atmosphere (FOB).

For the obtained pattern film, a photoluminescent peak wavelength, a blue light absorption rate, and a photoconversion efficiency are measured and the results are shown in Table 3.

Example 2

1. An InP/ZnSe/ZnS quantum dot is prepared in the same manner as set forth in Example 1, except that per one mole of indium, a total amount of the Se and a total amount of the S as used are 3 moles and 6 moles, respectively. For the obtained QD solution, an ICP-AES analysis is made and the results are shown in Table 1. A UV-vis absorption spectroscopic analysis and a photoluminescence spectroscopic analysis are made for the QD solution, and the results are shown in Table 2.

2. A quantum dot polymer composite is prepared in the same manner as set forth in Example 1 except for using the quantum dot as obtained above. For the obtained film pattern, a photoluminescent peak wavelength, a blue light absorption rate, and a photoconversion efficiency are measured and the results are shown in Table 3.

Comparative Example 1

1. An InP/ZnSe/ZnS quantum dot is prepared in the same manner as set forth in Example 1, except that per one mole of indium, a total amount of the Se and a total amount of the S as used are 9 moles and 27 moles, respectively. For the obtained QD solution, an ICP-AES analysis is made and the results are shown in Table 1. A UV-vis absorption spectroscopic analysis and a photoluminescence spectroscopic analysis are made for the QD solution, and the results are shown in Table 2.

2. A quantum dot polymer composite is prepared in the same manner as set forth in Example 1 except for using the quantum dot as obtained above. For the obtained film pattern, a photoluminescent peak wavelength, a blue light absorption rate, and a photoconversion efficiency are measured and the results are shown in Table 3.

Comparative Example 2-1

1. An InP/ZnSe/ZnS quantum dot is prepared in the same manner as set forth in Example 1, except that per one mole of indium, a total amount of the Se as used is 3 moles, a total amount of the S as used is 6 moles, and the reaction time for the formation of the first semiconductor shell is 30 minutes. For the obtained QD solution, an ICP-AES analysis is made and the results are shown in Table 1. A UV-vis absorption spectroscopic analysis and a photoluminescence spectroscopic analysis are made for the QD solution, and the results are shown in Table 2.

2. A quantum dot polymer composite is prepared in the same manner as set forth in Example 1 except for using the quantum dot as obtained above. For the obtained film pattern, a photoluminescent peak wavelength, a blue light absorption rate, and a photoconversion efficiency are measured and the results are shown in Table 3.

Comparative Example 2-2

A quantum dot including a ZnSeS shell on the InP core is prepared in the same manner as set forth in Example 1, except that per one mole of indium, a total amount of the Se and a total amount of the S as used are 5 moles and 33 moles, respectively, and a mixture of the S precursor and the Se precursor is first injected and then the S precursor is injected. For the obtained QD solution, an ICP-AES analysis is made and the results are shown in Table 1. A UV-vis absorption spectroscopic analysis and a photoluminescence spectroscopic analysis are made for the QD solution, and the results are shown in Table 2.

TABLE 1

| | Relative molar amount (ratio) | | | |
| --- | --- | --- | --- | --- |
| | S | Se + S | In | In/(Se + S) |
| Comp. Example 1 | 9.40 | 18.64 | 1 | 0.053 |
| Example 1 | 2.982 | 6.929 | 1 | 0.144 |
| Example 2 | 1.97 | 4.75 | 1 | 0.210 |
| Comp. Example 2-1 | 2.34 | 3.26 | 1 | 0.307 |
| Comp. Example 2-2 | 11.68 | 17.24 | 1 | 0.058 |

TABLE 2

| | PL (nm) | FWHM (nm) | QY (%) | Blue light absorption rate per gram of the quantum dot | Abs at 450 nm/1 st peak |
| --- | --- | --- | --- | --- | --- |
| Comp. Example 1 | 623 | 38 | 89 | 2.45 | 2.5 |
| Example 1 | 623 | 41 | 90 | 4.15 | 2.45 |
| Example 2 | 620 | 46 | 90 | 5.07 | 2.1 |
| Comp. Example 2-1 | 631 | 50 | 90 | 5.54 | 1.64 |
| Comp. Example 2-2 | 630 | 47 | 72% | 2.58 | 2.3 |

TABLE 3

| | Blue light absorption rate (%) | Conversion Efficiency (CE) (%) after POB |
| --- | --- | --- |
| Comp. Example 1 | 81 | 29.1 |
| Example 1 | 87 | 28 |
| Example 2 | 88 | 26.3 |
| Comp. Example 2-1 | 90 | 18.3 |

The results of the tables confirm that when the value of In/(Se+S) is greater than or equal to 0.06 and less than or equal to 0.3, the red light emitting QD may exhibit enhanced optical properties and improved stability. The prepared quantum dot may exhibit enhanced blue light absorption, which may contribute the increase in the luminous efficiency of the quantum dot polymer composite.

Green Quantum Dots

Example 3

1. An InZnP/ZnSe/ZnS quantum dot is prepared in the same manner as set forth in Example 1, except that the InZnP core prepared in Reference Example 2 is used and per one mole of indium, a total amount of the Se and a total amount of the S as used are 13 moles and 36 moles, respectively. For the obtained QD solution, an ICP-AES analysis is made and the results are shown in Table 4. A UV-vis absorption spectroscopic analysis and a photoluminescence spectroscopic analysis are made for the QD solution, and the results are shown in Table 5.

2. A quantum dot polymer composite is prepared in the same manner as set forth in Example 1 except for using the quantum dot as obtained above. For the obtained film pattern, a photoluminescent peak wavelength, a blue light absorption rate, and a photoconversion efficiency are measured and the results are shown in Table 6.

Example 4

1. An InZnP/ZnSe/ZnS quantum dot is prepared in the same manner as set forth in Example 1, except that the InZnP core prepared in Reference Example 2 is used and per one mole of indium, a total amount of the Se and a total amount of the S as used are 10 moles and 33 moles, respectively. For the obtained QD solution, an ICP-AES analysis is made and the results are shown in Table 4. A UV-vis absorption spectroscopic analysis and a photoluminescence spectroscopic analysis are made for the QD solution, and the results are shown in Table 5.

2. A quantum dot polymer composite pattern is prepared in the same manner as set forth in Example 1 except for using the quantum dot as obtained above. For the obtained film pattern, a photoluminescent peak wavelength, a blue light absorption rate, and a photoconversion efficiency are measured and the results are shown in Table 6.

Example 5

An InZnP/ZnSe/ZnS quantum dot is prepared in the same manner as set forth in Example 1, except that the InZnP core prepared in Reference Example 2 is used, per one mole of indium, a total amount of the Se and a total amount of the S as used are 5 moles and 30 moles, respectively, and the duration for the formation of the $1^{st}$ semiconductor shell is about 120 minutes. For the obtained QD solution, an ICP-AES analysis is made and the results are shown in Table 4. A UV-vis absorption spectroscopic analysis and a photoluminescence spectroscopic analysis are made for the QD solution, and the results are shown in Table 5.

A quantum dot polymer composite is prepared in the same manner as set forth in Example 1 except for using the quantum dot as obtained above. For the obtained film pattern, a photoluminescent peak wavelength, a blue light absorption rate, and a photoconversion efficiency are measured and the results are shown in Table 6.

Example 6

An InZnP/ZnSe/ZnS quantum dot is prepared in the same manner as set forth in Example 1, except that the InZnP core prepared in Reference Example 2 is used, per one mole of indium, a total amount of the Se and a total amount of the S as used are 12 moles and 36 moles, respectively, and the duration for the formation of the $1^{st}$ semiconductor shell is about 120 minutes. For the obtained QD solution, an ICP-AES analysis is made and the results are shown in Table 4. A UV-vis absorption spectroscopic analysis and a photoluminescence spectroscopic analysis are made for the QD solution, and the results are shown in Table 5.

A quantum dot polymer composite is prepared in the same manner as set forth in Example 1 except for using the quantum dot as obtained above. For the obtained film pattern, a photoluminescent peak wavelength, a relative blue light absorption, and a photoconversion efficiency are measured and the results are shown in Table 6.

Comparative Example 3

An InZnP/ZnSe/ZnS quantum dot is prepared in the same manner as set forth in Example 1, except that the InZnP core prepared in Reference Example 2 is used, per one mole of indium, a total amount of the Se and a total amount of the S as used are 26 moles and 39 moles, respectively, and the duration for the formation of the $1^{st}$ semiconductor shell is about 120 minutes. For the obtained QD solution, an ICP-AES analysis is made and the results are shown in Table 4. A UV-vis absorption spectroscopic analysis and a photoluminescence spectroscopic analysis are made for the QD solution, and the results are shown in Table 5.

A quantum dot polymer composite is prepared in the same manner as set forth in Example 1 except for using the quantum dot as obtained above. For the obtained film pattern, a photoluminescent peak wavelength, a blue light absorption rate, and a photoconversion efficiency are measured and the results are shown in Table 6.

Comparative Example 4

An InZnP/ZnSe/ZnS quantum dot is prepared in the same manner as set forth in Example 1, except that the InZnP core prepared in Reference Example 2 is used, per one mole of indium, a total amount of the Se and a total amount of the S as used are 3 moles and 18 moles, respectively, and the duration for the formation of the $1^{st}$ semiconductor shell is about 120 minutes. For the obtained QD solution, an ICP-AES analysis is made and the results are shown in Table 4.

A quantum dot polymer composite is prepared in the same manner as set forth in Example 1 except for using the quantum dot as obtained above. For the obtained film pattern, a photoluminescent peak wavelength, a blue light absorption rate, and a photoconversion efficiency are measured and the results are shown in Table 6.

Comparative Example 5

An InZnP/ZnSe/ZnS quantum dot is prepared in the same manner as set forth in Example 1, except that the InZnP core prepared in Reference Example 2 is used, per one mole of indium, a total amount of the Se and a total amount of the S as used are 14 moles and 51 moles, respectively, and the duration for the formation of the $1^{st}$ semiconductor shell is about 120 minutes. For the obtained QD solution, an ICP-AES analysis is made and the results are shown in Table 4. A UV-vis absorption spectroscopic analysis and a photoluminescence spectroscopic analysis are made for the QD solution, and the results are shown in Table 5.

TABLE 4

| | Relative molar amount | | | |
|---|---|---|---|---|
| | S | Se + S | In | In/(Se + S) |
| Comp. Example 3 | 13 | 39 | 1 | 0.025 |
| Example 3 | 12.1 | 24.7 | 1 | 0.040 |
| Example 4 | 11.5 | 21.6 | 1 | 0.046 |
| Example 5 | 10.8 | 15.7 | 1 | 0.064 |
| Comp. Example 4 | 6 | 8.67 | 1 | 0.115 |
| Example 6 | 12 | 24 | 1 | 0.042 |
| Comp. Example 5 | 17.7 | 31.4 | 1 | 0.32 |

TABLE 5

| | PL (nm) | FWHM (nm) | QY (%) | Blue light absorption per gram of the quantum dot | Abs at 450 nm/ 1 st peak |
|---|---|---|---|---|---|
| Comp. Example 3 | 517 | 42 | 80 | less than 1 | 0.94 |
| Example 3 | 530 | 38 | 94 | 2.82 | 1.2 |
| Example 4 | 529 | 39 | 88 | 3.21 | 1.2 |
| Example 5 | 530 | 39 | 85 | 4.19 | 1.2 |
| Example 6 | 533 | 39 | 85 | 2.5 | 2.0 |
| Comp. Example 5 | 533 | 39 | 76 | Less than 1 | 1.0 |

TABLE 6

| | Blue light absorption rate (%) | CE (%) after POB |
|---|---|---|
| Comp. Example 3 | 86.8 | 24.1 |
| Example 3 | 89.7 | 30.8 |
| Example 4 | 90.2 | 30.7 |
| Example 5 | 91.7 | 27.4 |
| Example 6 | 88.0 | 30.3 |
| Comp. Example 4 | 89.3 | 17.8 |

Figure 5:
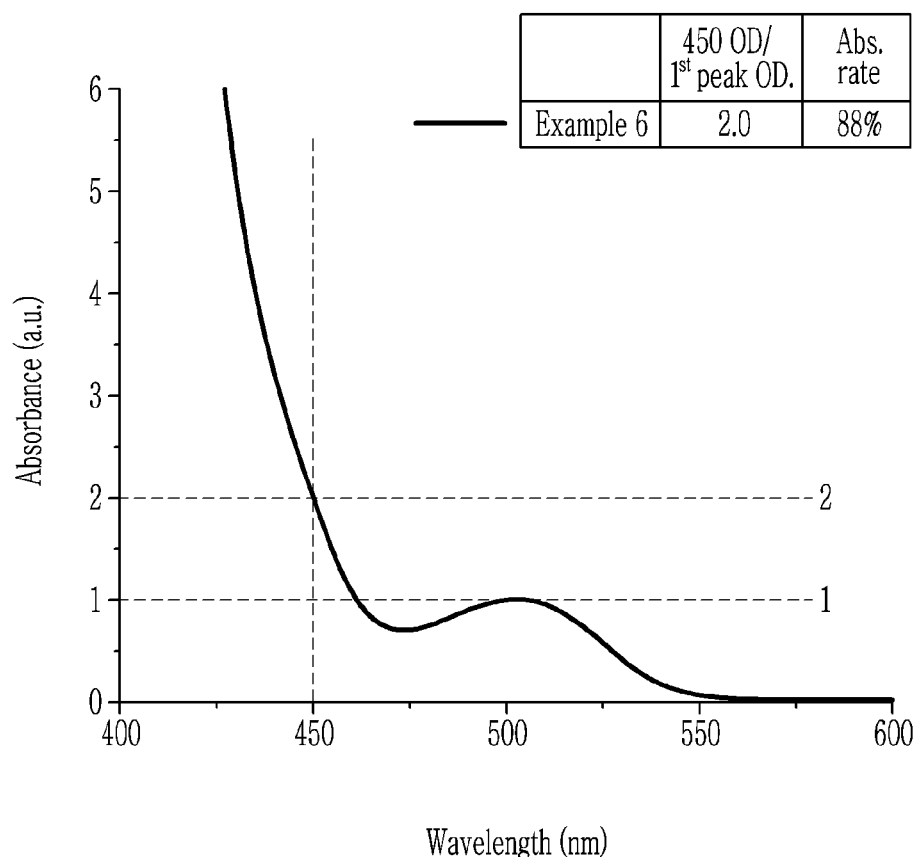
FIG. 5 is a graph of absorbance (arbitrary units, a.u.) versus wavelength (nanometers, nm) illustrating a UV-Vis absorption spectrum of the quantum dots prepared in Example 6.

FIG. 5 is a graph of absorbance (arbitrary units, a.u.) versus wavelength (nanometers, nm) illustrating a UV-Vis absorption spectrum of the quantum dots prepared in Example 6.

The results of the tables confirm that when the value of In/(Se+S) is greater than or equal to 0.027 and less than or equal to 0.1, the green light emitting QD may exhibit enhanced optical properties and improved stability. The prepared quantum dot may exhibit enhanced blue light absorption, which may contribute the increase in the luminous efficiency of the quantum dot polymer composite.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. Cadmium free quantum dots, each comprising:
a semiconductor nanocrystal core comprising indium and phosphorous,
a semiconductor nanocrystal shell disposed on the semiconductor nanocrystal core, the semiconductor nanocrystal shell comprising zinc, selenium, and sulfur,
wherein the cadmium free quantum dots do not comprise cadmium,
wherein in the cadmium free quantum dots, a molar ratio of selenium to indium is from about 5:1 to about 15:1, wherein the cadmium free quantum dots are configured to emit a red light or a green light, and the green light has a full width at half maximum of less than 40 nanometers.

2. The cadmium free quantum dots of claim 1, wherein in an ultraviolet-visible absorption spectrum of the cadmium free quantum dot, a ratio of an intensity of 450 nanometers to that of the first absorption peak wavelength is greater than or equal to about 1.1:1.

3. The cadmium free quantum dots of claim 1, wherein the semiconductor nanocrystal core further comprises zinc.

4. The cadmium free quantum dots of claim 1, wherein the molar ratio of selenium to indium is from about 5:1 to about 10:1.

5. The cadmium free quantum dots of claim 1, wherein the molar ratio of selenium to indium is from about 6:1 to about 9:1.

6. The cadmium free quantum dots of claim 1, wherein the full width at half maximum is less than or equal to about 39 nanometers.

7. The cadmium free quantum dots of claim 1, wherein the full width at half maximum is less than or equal to about 38 nanometers.

8. The cadmium free quantum dots of claim 1, wherein the cadmium free quantum dots emit green light and a blue light absorption per one gram of the cadmium free quantum dot is greater than or equal to about 2.

9. The cadmium free quantum dots of claim 1, wherein the red light has a photoluminescent peak wavelength of from about 600 nanometers to about 650 nanometers and the green light has a photoluminescent peak wavelength of from about 500 nanometers to about 550 nanometers.

10. The cadmium free quantum dots of claim 1, wherein the cadmium free quantum dots have a quantum yield of greater than about 80%.

11. The cadmium free quantum dots of claim 1, wherein in an ultraviolet-visible absorption spectrum of the cadmium free quantum dot, a ratio of an intensity of 450 nanometers to that of the first absorption peak wavelength is greater than or equal to about 1.5:1.

12. The cadmium free quantum dots of claim 1, wherein a blue light absorption per one gram of the cadmium free quantum dot is from about 1.1 to about 5.07.

13. The cadmium free quantum dots of claim 1, wherein the cadmium free quantum dots have a quantum yield of greater than about 85%.

14. The cadmium free quantum dots of claim 1, wherein the first absorption peak wavelength of the cadmium free quantum dot is present within a range of greater than about 450 nanometers and less than a photoluminescent peak wavelength of the cadmium free quantum dot.

15. A composition comprising:
the cadmium free quantum dots of claim 1;
a polymerizable monomer; and
an initiator.

16. The composition of claim 15, wherein the composition further comprises a thiol compound, a metal oxide particle, or a combination thereof.

17. A quantum dot-polymer composite comprising:
a polymer matrix; and
the cadmium free quantum dots of claim 1 dispersed in the polymer matrix.

18. The quantum dot-polymer composite of claim 17, wherein the quantum dot-polymer composite has a blue light absorption rate of greater than or equal to about 82% with respect to light having a wavelength of 450 nanometers, a photoconversion efficiency of greater than or equal to about 20%, or a combination thereof.

19. A display device, comprising
a light source and
a light emitting element comprising the cadmium free quantum dots of claim 1,
wherein the light emitting element and the light source is configured to provide the light emitting element with incident light.

20. The display device of claim 19, wherein, the light source comprises a plurality of light emitting unit, and each light emitting unit of the light source emit blue light, green light, or a combination thereof.

21. The display device of claim 19, wherein the display device comprises an organic light emitting diode as the light source, a first optical filter cutting blue light, green light or a combination thereof, a second optical filter reflecting light of a wavelength of greater than 500 nanometers, a liquid crystal layer, or a combination thereof.

22. The display device of claim 19, wherein the light emitting element comprises
a sheet of the quantum dot polymer composite, or
a stacked structure comprising a substrate and a light emitting layer disposed on the substrate, wherein the light emitting layer comprises a pattern of the quantum dot polymer composite and the pattern comprises a first section configured to emit a first light, a second section configured to emit a second light having a different center wavelength from the first light, or a combination thereof.

23. A quantum dot polymer composite comprising a polymer matrix and a plurality of cadmium free quantum dots dispersed in the polymer matrix,
wherein each of the cadmium free quantum dots has a core comprising a first semiconductor nanocrystal comprising indium and phosphorus and a semiconductor nanocrystal shell comprising zinc, selenium, and sulfur,
wherein in the plurality of cadmium free quantum dots, a mole ratio of selenium with respect to indium is from about 5:1 to about 15:1,
wherein the plurality of the cadmium free quantum dots are configured to emit a red light or a green light, and the green light has a full width at half maximum of less than 40 nanometers,
wherein the quantum dot polymer composite is in a form of sheet, and a thickness of the sheet is greater than or equal to about 10 um and less than or equal to about 1,000 um.

24. The display device of claim 23, wherein the quantum dot polymer composite show a blue light absorption rate of greater than or equal to about 82% with respect to light having a wavelength of about 450 nanometers.

25. The display device of claim 23, wherein the quantum dot polymer composite show a blue light absorption rate of greater than or equal to about 88% with respect to light having a wavelength of about 450 nanometers.

26. The display device of claim 23, wherein the mole ratio of selenium with respect to indium is from about 6:1 to about 10:1.

* * * * *